(12) United States Patent
Yoon et al.

(10) Patent No.: US 11,862,491 B2
(45) Date of Patent: Jan. 2, 2024

(54) APPARATUS AND METHOD FOR TREATING SUBSTRATE

(71) Applicant: SEMES CO., LTD., Cheonan-si (KR)

(72) Inventors: Dohyeon Yoon, Cheonan-si (KR); Joo Jib Park, Asan-si (KR); Jin Se Park, Incheon (KR)

(73) Assignee: Semes Co., Ltd., Chungcheongnam-do (KR)

( * ) Notice: Subject to any disclaimer, the term of this patent is extended or adjusted under 35 U.S.C. 154(b) by 431 days.

(21) Appl. No.: 16/925,449

(22) Filed: Jul. 10, 2020

(65) Prior Publication Data
US 2021/0013064 A1    Jan. 14, 2021

(30) Foreign Application Priority Data

Jul. 11, 2019 (KR) .......................... 10-2019-0083570

(51) Int. Cl.
| | |
|---|---|
| *H01L 21/67* | (2006.01) |
| *B08B 7/00* | (2006.01) |
| *H01L 21/02* | (2006.01) |
| *H01L 21/677* | (2006.01) |

(52) U.S. Cl.
CPC ...... *H01L 21/67115* (2013.01); *B08B 7/0021* (2013.01); *H01L 21/02101* (2013.01); *H01L 21/67034* (2013.01); *H01L 21/67742* (2013.01)

(58) Field of Classification Search
CPC ......... H01L 21/67115; H01L 21/02101; H01L 21/67034; H01L 21/67742; H01L 21/67098; B08B 7/0071; H05B 1/0233

USPC ........................................................ 134/84
See application file for complete search history.

(56) References Cited

U.S. PATENT DOCUMENTS

| | | | | |
|---|---|---|---|---|
| 5,580,421 | A * | 12/1996 | Hiatt ................ | H01L 21/02046 257/E21.258 |
| 6,015,503 | A * | 1/2000 | Butterbaugh ..... | H01L 21/67017 257/E21.252 |
| 2002/0150395 | A1* | 10/2002 | Shimizu ............ | H01L 21/67115 219/390 |

(Continued)

FOREIGN PATENT DOCUMENTS

| | | |
|---|---|---|
| JP | 60-28235 A | 2/1985 |
| JP | 60-240128 A | 11/1985 |

(Continued)

OTHER PUBLICATIONS

Korean Office Action dated Sep. 16, 2020 issued in corresponding Korean Appln. No. 10-2019-0083570.

(Continued)

*Primary Examiner* — David G Cormier
*Assistant Examiner* — Thomas Bucci
(74) *Attorney, Agent, or Firm* — Harness, Dickey & Pierce, P.L.C.

(57) ABSTRACT

An apparatus for treating a substrate includes a light treatment chamber having an interior space, a support unit that supports the substrate in the interior space, and an irradiation unit that irradiates light to the substrate in the interior space to remove organic matter remaining on the substrate, in which the irradiation unit includes a first light source that irradiates first light to the substrate and a second light source that irradiates, to the substrate, second light having a different wavelength range from the first light.

20 Claims, 16 Drawing Sheets

(56) References Cited

U.S. PATENT DOCUMENTS

| | | | | |
|---|---|---|---|---|
| 2004/0241991 | A1* | 12/2004 | Aoyama | H01L 21/28202 438/689 |
| 2009/0065027 | A1* | 3/2009 | Kawamura | H01L 21/02087 134/105 |
| 2012/0067864 | A1* | 3/2012 | Kusuda | H01L 21/67115 219/385 |
| 2014/0238970 | A1* | 8/2014 | Johnson | H01L 21/67115 362/228 |
| 2014/0306603 | A1* | 10/2014 | Bachman | H01J 65/044 315/35 |
| 2015/0136186 | A1* | 5/2015 | Brown | H01L 21/67051 134/113 |
| 2019/0304821 | A1* | 10/2019 | Pierreux | H01L 21/67063 |
| 2020/0388484 | A1* | 12/2020 | Cho | H01L 21/02046 |

FOREIGN PATENT DOCUMENTS

| | | |
|---|---|---|
| JP | H8-509652 A | 10/1996 |
| JP | 2005-286162 A | 10/2005 |
| JP | 2014-003277 A | 1/2014 |
| JP | 2016-503588 A | 2/2016 |
| JP | 2016/189454 A | 11/2016 |
| JP | 2019-24104 A | 2/2019 |
| KR | 10-2001-0034992 A | 5/2001 |
| KR | 10-2015-0042133 A | 4/2015 |
| KR | 10-2015-0138975 A | 12/2015 |
| KR | 10-2016-0026302 A | 3/2016 |
| KR | 10-2016-0115398 A | 10/2016 |
| KR | 101672735 B1 | 11/2016 |
| KR | 101870659 B1 | 6/2018 |
| KR | 10-2019-0061932 A | 6/2019 |

OTHER PUBLICATIONS

Korean Office Action dated May 18, 2021 issued in corresponding Korean Patent Application No. 10-2019-0083570.
Japanese Office Action dated Nov. 8, 2022 issued in Japanese Patent Application No. 2020-119121.
Notice of Allowance dated Apr. 25, 2023 issued in corresponding Japanese Patent Application No. 2020-119121.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0083570 filed on Jul. 11, 2019, in the Korean Intellectual Property Office, the entire contents of which are hereby incorporated by reference.

BACKGROUND

Embodiments of the inventive concept described herein relate to an apparatus and method for treating a substrate.

Various processes, such as deposition, photolithography, etching, cleaning, and the like, are performed to manufacture semiconductor elements. Among these processes, the photolithography process includes a coating process, an exposing process, and a developing process. The coating process is a process of coating a substrate with a light-sensitive liquid such as photoresist. The exposing process is a process of exposing the coated photoresist film to light of a light source through a photomask to form a circuit pattern on the substrate. The developing process is a process of selectively developing the exposed area of the substrate.

In general, the developing process includes a developing solution supply step, a rinsing solution supply step, and a drying step. In the drying step, a spin dry method of drying a developing solution or a rinsing solution remaining on the substrate using a centrifugal force exerted on the substrate by a rotating spin chuck that supports the substrate is performed. Alternatively, in the drying step, supercritical drying may be performed by supplying a supercritical fluid to the substrate. In the supercritical drying step, an organic solvent having low surface tension is supplied to the developing solution or the rinsing solution remaining on the substrate. Accordingly, the developing solution or the rinsing solution remaining on the substrate is replaced by the organic solvent. The organic solvent on the substrate is dried by supplying the supercritical fluid.

However, as the critical dimension (CD) between patterns formed on a substrate is scaled down, a leaning phenomenon in which the patterns collapse or bend occurs when the above-described spin dry method is performed. Furthermore, due to the scaling down of the critical dimension (CD) between the patterns formed on the substrate, organic matter remaining on the substrate cannot be appropriately removed. The organic matter deteriorates efficiency in treating the substrate.

SUMMARY

Embodiments of the inventive concept provide a substrate treating apparatus and method for improving efficiency in treating a substrate.

In addition, embodiments of the inventive concept provide a substrate treating apparatus and method for efficiently removing organic matter remaining on a substrate.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a light treatment chamber having an interior space, a support unit that supports the substrate in the interior space, and an irradiation unit that irradiates light to the substrate in the interior space to remove organic matter remaining on the substrate, in which the irradiation unit includes a first light source that irradiates first light to the substrate and a second light source that irradiates, to the substrate, second light having a different wavelength range from the first light.

According to an embodiment, the irradiation unit may further include a third light source that irradiates, to the substrate, third light having a different wavelength range from the first light and the second light.

According to an embodiment, the first light source may be a flash lamp, the second light source may be one of an infrared lamp and an ultraviolet lamp, and the third light source may be the other of the infrared lamp and the ultraviolet lamp.

According to an embodiment, the first light source may be one of a flash lamp, an infrared lamp, and an ultraviolet lamp, and the second light source may be another one of the flash lamp, the infrared lamp, and the ultraviolet lamp.

According to an embodiment, the first light source may be the flash lamp, and the second light source may be one of the infrared lamp and the ultraviolet lamp.

According to an embodiment, the support unit may include a support plate that supports the substrate and a lifting actuator that raises or lowers the support plate.

According to an embodiment, the support unit may include a support plate that supports the substrate and a rotary actuator that rotates the support plate.

According to an embodiment, the irradiation unit may further include a reflector that reflects the light irradiated by the irradiation unit toward a surface of the substrate supported on the support unit.

According to an embodiment, the irradiation unit may further include a first cooling line through which a cooling fluid circulates to lower the temperature of a light source included in the irradiation unit.

According to an embodiment, the light treatment chamber may include a second cooling line that is connected with the first cooling line and through which the cooling fluid circulates.

According to an embodiment, the apparatus may further include a supercritical chamber that treats the substrate by supplying a supercritical fluid to the substrate, a transfer unit that transfers the substrate between the supercritical chamber and the light treatment chamber, and a controller. The controller may control the supercritical chamber, the transfer unit, and the light treatment chamber such that the substrate is treated in the supercritical chamber and the substrate treated in the supercritical chamber is transferred to the light treatment chamber.

According to an embodiment, the apparatus may further include a liquid treatment chamber that treats the substrate by dispensing an organic solvent onto the substrate, a transfer unit that transfers the substrate between the liquid treatment chamber and the light treatment chamber, and a controller. The controller may control the liquid treatment chamber, the transfer unit, and the light treatment chamber such that the substrate is treated in the liquid treatment chamber and the substrate treated in the liquid treatment chamber is transferred to the light treatment chamber.

According to an embodiment, the apparatus may further include an index module having a load port on which a carrier having the substrate received therein is mounted and a process module that is connected with the index module and that treats the substrate, and the light treatment chamber may be provided at the index module.

According to an embodiment, the light treatment chamber may be installed on the load port.

According to an embodiment, the index module may include a front panel on which the load port is installed, a rear panel disposed to be opposite to the front panel, and side panels that connect the front panel and the rear panel when viewed from above, and the light treatment chamber may be installed on the side panel.

According to an embodiment, light sources that irradiate the light may have a bar shape, and the light sources may be alternately disposed over the support unit.

According to an embodiment, light sources that irradiate the light may have a block shape, and the light sources may be arranged in a lateral direction and/or a longitudinal direction.

According to an embodiment, the irradiation unit may further include a plate disposed over the support unit, and the light sources having the block shape may be provided on the plate so as to be detachable.

According to an embodiment, when viewed from above, the light sources may be alternately mounted on the plate such that adjacent light sources differ from one another.

According to an exemplary embodiment, a method for treating a substrate may include a light treatment step of removing remaining organic matter by irradiating light to the substrate, and the light irradiated to the substrate in the light treatment step may include first light and second light having a different wavelength range from the first light.

According to an embodiment, in the light treatment step, the organic matter may be removed by additionally irradiating third light having a different wavelength range from the first light and the second light.

According to an embodiment, the first light may be one of a flash, energy of which is alternately changed every predetermined interval, infrared light, and ultraviolet light, and the second light may be another one of the flash, the infrared light, and the ultraviolet light.

According to an embodiment, the first light may be the flash, and the second light may be one of the infrared light and the ultraviolet light.

According to an embodiment, in the light treatment step, a distance between the substrate and an irradiation unit that irradiates the light may be adjusted.

According to an embodiment, the method may further include a supercritical treatment step of treating the substrate by supplying a supercritical fluid to the substrate, and the light treatment step may be performed after the supercritical treatment step.

According to an embodiment, the method may further include a liquid treatment step of treating the substrate by dispensing an organic solvent onto the substrate, and the light treatment step may be performed after the liquid treatment step.

According to an embodiment, the first light and the second light may be simultaneously irradiated to the substrate.

According to an embodiment, the substrate or a light source that irradiates the light may be rotated while the light is irradiated to the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
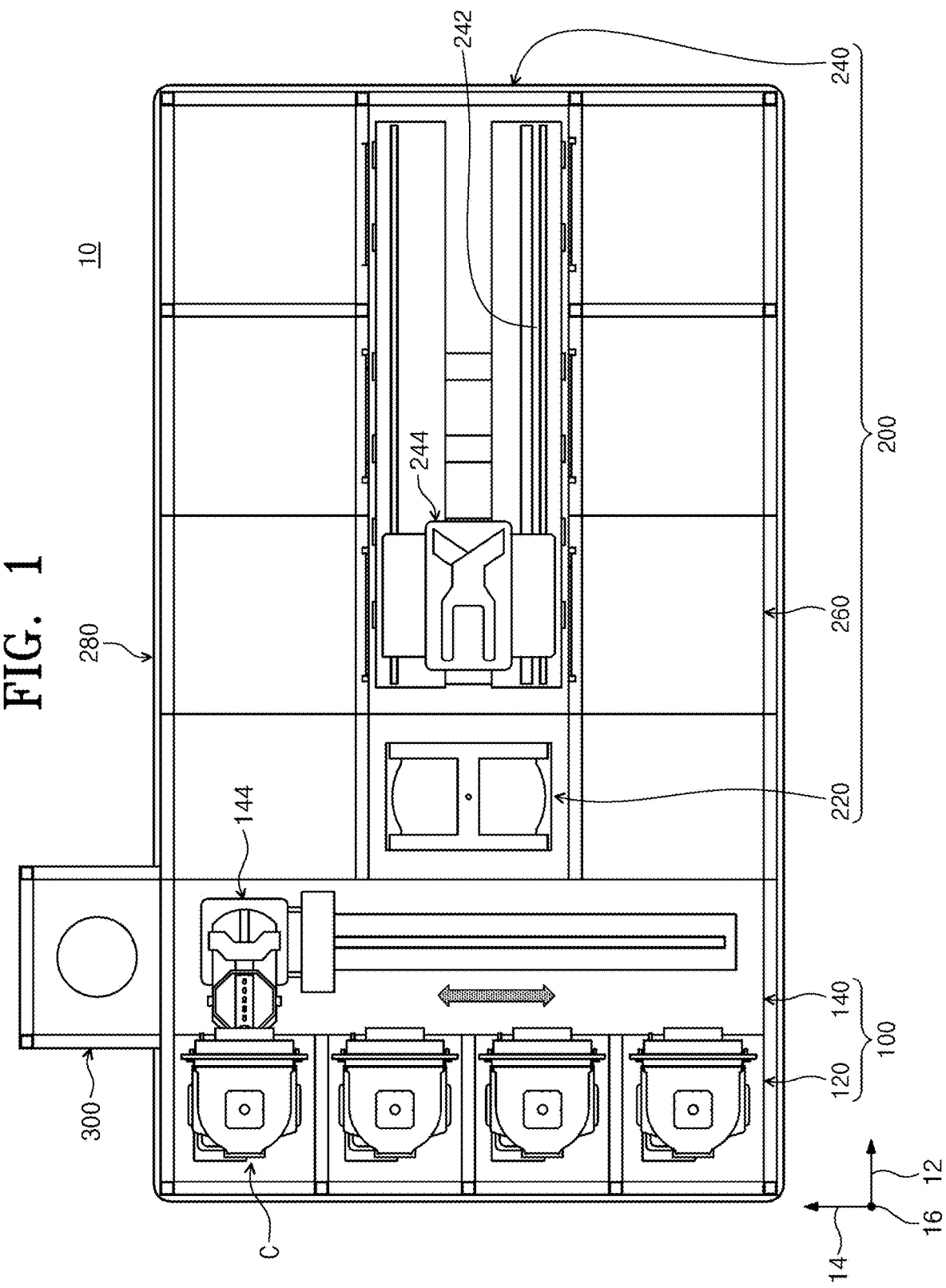
FIG. 1 is a schematic plan view illustrating a substrate treating apparatus of the inventive concept.

As the inventive concept allows for various changes and numerous embodiments, exemplary embodiments will be illustrated in the drawings and described in detail in the written description. However, this is not intended to limit the inventive concept to particular modes of practice, and it should be appreciated that all changes, equivalents, and substitutes that do not depart from the spirit and scope of the inventive concept are encompassed in the inventive concept. In describing the inventive concept, detailed descriptions related to well-known functions or configurations will be omitted when they may make subject matters of the inventive concept obscure.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms such as first, second, and the like may be used to describe various components, but the components should not be limited by the terms. The terms may be used only for distinguishing one component from others.

Hereinafter, embodiments according to the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

FIG. 1 is a schematic plan view illustrating a substrate treating apparatus of the inventive concept.

Referring to FIG. 1, the substrate treating apparatus 10 includes an index module 100 and a process module 200.

The index module 100 may include a load port 120, an index chamber 140, and a light treatment chamber 300.

The load port 120, the index chamber 140, and the process module 200 are sequentially arranged in a row. Hereinafter, a direction in which the load port 120, the index chamber 140, and the process module 200 are arranged is referred to as a first direction 12. A direction perpendicular to the first direction 12 when viewed from above is referred to as a second direction 14, and a direction perpendicular to the plane including the first direction 12 and the second direction 14 is referred to as a third direction 16.

A carrier C having substrates W received therein is seated on the load port 120. A plurality of load ports 120 are provided. The load ports 120 are disposed in a row along the second direction 14. FIG. 1 illustrates one example that the index module 100 includes four load ports 120. However, the number of load ports 120 may be increased or decreased depending on conditions such as process efficiency and footprint of the process module 200. Slots (not illustrated) that support edges of the substrates W are formed in the carrier C. The slots are arranged in the third direction 16. The substrates W are located in the carrier C so as to be stacked in a state of being spaced apart from each other along the third direction 16. A front opening unified pod (FOUP) may be used as the carrier C.

The index chamber 140 is located between the load ports 120 and a load-lock chamber 220. The index chamber 140 has a rectangular parallelepiped shape including a front panel, a rear panel, and opposite side panels and includes, in the interior thereof, an index robot 144 for transferring the substrates W between the carriers C seated on the load ports 120, the load-lock chamber 220, and the light treatment chamber 300. Although not illustrated, controlled air flow systems, such as vents and a laminar flow system, may be included in the index chamber 140 to prevent introduction of particle contaminants into the interior space of the index chamber 140.

The light treatment chamber 300 may be provided at one side of the index chamber 140. A specific configuration of the light treatment chamber 300 will be described below.

The process module 200 may include the load-lock chamber 220, a transfer chamber 240, liquid treatment chambers 260, and supercritical chambers 280.

The transfer chamber 240 is disposed such that the lengthwise direction thereof is parallel to the first direction 12. The liquid treatment chambers 260 or the supercritical chambers 280 are disposed on one side and an opposite side of the transfer chamber 240 along the second direction 14. The liquid treatment chambers 260 located on the one side of the transfer chamber 240 and the supercritical chambers 280 located on the opposite side of the transfer chamber 240 may be symmetric to each other with respect to the transfer chamber 240.

Some of the liquid treatment chambers 260 may be disposed along the lengthwise direction of the transfer chamber 240. Furthermore, other liquid treatment chambers 260 may be disposed to be stacked one above another. That is, the liquid treatment chambers 260 may be disposed in an A×B array (A and B being natural numbers of 1 or larger) on the one side of the transfer chamber 240. Here, "A" denotes the number of liquid treatment chambers 260 provided in a row along the first direction 12, and "B" denotes the number of liquid treatment chambers 260 provided in a column along the third direction 16. In a case where four or six liquid treatment chambers 260 are provided on the one side of the transfer chamber 240, the liquid treatment chambers 260 may be disposed in a 2×2 or 3×2 array. The number of liquid treatment chambers 260 may be increased or decreased. Alternatively, the liquid treatment chambers 260 may be provided on only the one side of the transfer chamber 240. In another case, the liquid treatment chambers 260 may be provided in a single layer on the one side and the opposite side of the transfer chamber 240.

The supercritical chambers 280 may be provided similarly to the liquid treatment chambers 260 described above. On the opposite side of the transfer chamber 240, the supercritical chambers 280 may be disposed similarly to the liquid treatment chambers 260 described above. Although it has been exemplified that the liquid treatment chambers 260 are provided on the one side of the transfer chamber 240 and the supercritical chambers 280 are provided on the opposite side of the transfer chamber 240, the inventive concept is not limited thereto. For example, the arrangement of the liquid treatment chambers 260 and the supercritical chambers 280 may be modified in various ways.

The load-lock chamber 220 is disposed between the index chamber 140 and the transfer chamber 240. The load-lock chamber 220 provides a space in which the substrates W stay before transferred between the transfer chamber 240 and the index chamber 140. The load-lock chamber 220 has slots (not illustrated) therein, and the substrates W are placed in the slots. The slots (not illustrated) are spaced apart from each other along the third direction 16. In the load-lock chamber 220, a face opposite the index chamber 140 and a face opposite the transfer chamber 240 may be open.

The transfer chamber 240 may transfer the substrates W between the load-lock chamber 220, the liquid treatment chambers 260, and the supercritical chambers 280. A guide rail 242 and a main robot 244 may be provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12.

Hereinafter, components for transferring the substrates W are defined as a transfer unit. For example, the transfer chamber 240 and the index chamber 140 may be included in the transfer unit. In addition, the main robot 244 provided in the transfer chamber 240 and the index robot 144 may be included in the transfer unit.

Substrate treating apparatuses for performing cleaning processes on the substrates W may be provided in the liquid treatment chambers 260. For example, the cleaning processes may include a substrate cleaning process, a stripping process, and an organic-residue removal process that use treatment fluids containing alcohol content. The substrate treating apparatuses provided in the liquid treatment chambers 260 may have different structures depending on the types of cleaning processes performed. Selectively, the substrate treating apparatuses in the liquid treatment chambers 260 may have the same structure. Selectively, the liquid treatment chambers 260 may be divided into a plurality of groups. Substrate treating apparatuses provided in the liquid treatment chambers 260 belonging to the same group may have the same structure, and substrate treating apparatuses provided in the liquid treatment chambers 260 belonging to different groups may have different structures. For example, in a case where the liquid treatment chambers 260 are divided into two groups, a first group of liquid treatment chambers 260 may be provided on the one side of the transfer chamber 240, and a second group of liquid treatment chambers 260 may be provided on the opposite side of the transfer chamber 240. Selectively, on the one side and the opposite side of the transfer chamber 240, the first group of liquid treatment chambers 260 may be provided in a lower layer, and the second group of liquid treatment chambers 260 may be provided in an upper layer. The first group of liquid treatment chambers 260 and the second group of liquid treatment chambers 260 may be distinguished from each other depending on the types of chemicals used or the types of cleaning methods. Hereinafter, one example of the substrate treating apparatuses provided in the liquid treatment chambers 260 will be described.

Figure 2:
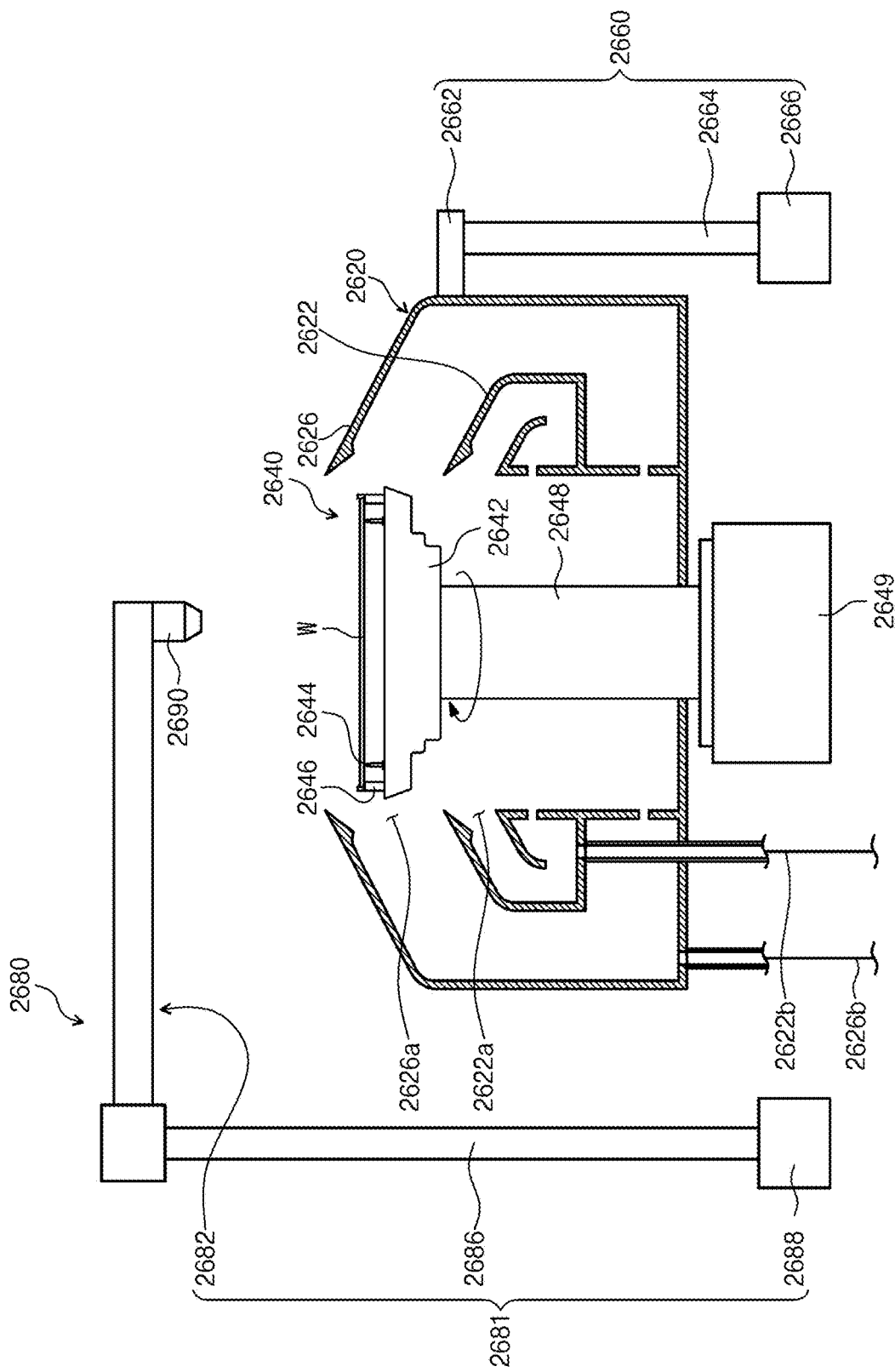
FIG. 2 is a view illustrating a substrate treating apparatus provided in a liquid treatment chamber of FIG. 1.

FIG. 2 is a view illustrating the substrate treating apparatus provided in the liquid treatment chamber of FIG. 1. Referring to FIG. 2, the substrate treating apparatus 2600 provided in the liquid treatment chamber includes a treatment vessel 2620, a substrate support unit 2640, a lifting unit 2660, and a liquid dispensing unit 2680. The substrate treating apparatus 2600 provided in the liquid treatment chamber 260 may dispense treatment liquids onto a substrate W. For example, the treatment liquids may include a chemical, a rinsing solution, and an organic solvent. The chemical may be a liquid having a property of acid or base. The chemical may include sulfuric acid ($H_2SO_4$), phosphoric acid ($P_2O_5$), hydrofluoric acid (HF), and ammonium hydroxide ($NH_4OH$). The chemical may be a diluted sulfuric acid peroxide (DSP) mixture. The rinsing solution may be deionized water ($H_2O$). The organic solvent may be isopropyl alcohol (IPA).

The treatment vessel 2620 provides a treatment space in which the substrate W is treated. The treatment vessel 2620 has a cylindrical shape that is open at the top. The treatment vessel 2620 has an inner recovery bowl 2622 and an outer recovery bowl 2626. The recovery bowls 2622 and 2626 recover different treatment liquids used for processes. The inner recovery bowl 2622 has an annular ring shape that surrounds the substrate support unit 2640, and the outer recovery bowl 2626 has an annular ring shape that surrounds the inner recovery bowl 2622. An inner space 2622a of the inner recovery bowl 2622 functions as the first inlet 2622a through which a treatment liquid is introduced into the inner recovery bowl 2622. A space 2626a between the inner recovery bowl 2622 and the outer recovery bowl 2626 functions as the second inlet 2626a through which a treatment liquid is introduced into the outer recovery bowl 2626. According to an embodiment, the inlets 2622a and 2626a may be located at different heights. Recovery line 2622b and 2626b are connected to lower surfaces of the bottoms of the recovery bowls 2622 and 2626. The treatment liquids introduced into the recovery bowls 2622 and 2626 may be supplied to an external treatment liquid regeneration system (not illustrated) through the recovery lines 2622b and 2626b and may be regenerated by the regeneration system.

The substrate support unit 2640 supports the substrate W in the treatment space. The substrate support unit 2640 supports and rotates the substrate W during a process. The substrate support unit 340 has a support plate 2642, a support pin 2644, a chuck pin 2646, and a rotary drive member. The support plate 2642 is provided in a substantially circular plate shape and has an upper surface and a lower surface. The lower surface has a smaller diameter than the upper surface. The upper surface and the lower surface are located such that the central axes thereof are in agreement with each other.

A plurality of support pins 2644 are provided. The support pins 2644 are disposed on an edge portion of the upper surface of the support plate 2642 so as to be spaced apart from each other at predetermined intervals. The support pins 2642 protrude upward from the support plate 2642. The support pins 2644 are disposed to form an annular ring shape as a whole by a combination thereof. The support pins 2644 support the edge of a rear surface of the substrate W such that the substrate W is spaced apart from the upper surface of the support plate 2642 by a predetermined distance.

A plurality of chuck pins 2646 are provided. The chuck pins 2646 are disposed farther away from the center of the support plate 2642 than the support pins 2644. The chuck pins 2646 protrude upward from the upper surface of the support plate 2642. The chuck pins 2646 support the side of the substrate W such that the substrate W does not deviate from a correct position to a side when the support plate 2642 is rotated. The chuck pins 2646 are rectilinearly movable between an outer position and an inner position along the radial direction of the support plate 2642. The outer position is a position farther away from the center of the support plate 2642 than the inner position. When the substrate W is loaded onto or unloaded from the support plate 2642, the chuck pins 2646 are located in the outer position, and when a process is performed on the substrate W, the chuck pins 2646 are located in the inner position. The inner position is a position in which the chuck pins 2646 and the side of the substrate W are brought into contact with each other, and the outer position is a position in which the chuck pins 2646 and the substrate W are spaced apart from each other.

The rotary drive member 2648 and 2649 rotates the support plate 2642. The support plate 2642 is rotatable about the central axis thereof by the rotary drive member 2648 and 2649. The rotary drive member 2648 and 2649 includes a support shaft 2648 and an actuator 2649. The support shaft 2648 has a cylindrical shape facing in the third direction 16. An upper end of the support shaft 2648 is fixedly coupled to the lower surface of the support plate 2642. According to an embodiment, the support shaft 2648 may be fixedly coupled to the center of the lower surface of the support plate 2642. The actuator 2649 provides a driving force to rotate the support shaft 2648. The support shaft 2648 is rotated by the actuator 2649, and the support plate 2642 is rotatable together with the support shaft 2648.

The lifting unit 2660 rectilinearly moves the treatment vessel 2620 in an up-down direction. The height of the treatment vessel 2620 relative to the support plate 2642 is changed as the treatment vessel 2620 is moved in the up-down direction. The lifting unit 2660 lowers the treatment vessel 2620 such that the support plate 2642 further protrudes upward beyond the treatment vessel 2620 when the substrate W is loaded onto or unloaded from the support plate 2642. Furthermore, when a process is performed, the height of the treatment vessel 2620 is adjusted depending on the types of treatment liquids dispensed onto the substrate W such that the treatment liquids are introduced into the preset recovery bowls 2622 and 2626. The lifting unit 2660 has a bracket 2662, a movable shaft 2664, and an actuator 2666. The bracket 2662 is fixedly attached to an outer wall of the treatment vessel 2620, and the movable shaft 2664 is fixedly coupled to the bracket 2664 and is moved in the up-down direction by the actuator 2666. Selectively, the lifting unit 2660 may move the support plate 2642 in the up-down direction.

The liquid dispensing unit 2680 dispenses a treatment liquid onto the substrate W. A plurality of liquid dispensing units 2680 may be provided. The liquid dispensing units 2680 may dispense different types of treatment liquids onto the substrate W. The liquid dispensing unit 2680 may include a movable member 2681 and a nozzle 2690.

The movable member 2681 moves the nozzle 2690 between a process position and a standby position. Here, the process position is defined as a position in which the nozzle 2690 is opposite the substrate W supported on the substrate support unit 2640, and the standby position is defined as a position in which the nozzle 2690 deviates from the process position. According to an embodiment, the process position includes a pre-treatment position and a post-treatment position. The pre-treatment position is a position in which the nozzle 2690 dispenses a treatment liquid to a first dispensing position, and the post-treatment position is a position in which the nozzle 2690 dispenses the treatment liquid to a second dispensing position. The first dispensing position may be a position closer to the center of the substrate W than the second dispensing position, and the second dispensing position may be a position including an end portion of the substrate W. Selectively, the second dispensing position may be an area adjacent to the end portion of the substrate W.

The movable member 2681 includes a support shaft 2686, an arm 2682, and an actuator 2688. The support shaft 2686 is located on one side of the treatment vessel 2620. The support shaft 2686 has a rod shape, the lengthwise direction of which is parallel to the third direction 16. The support shaft 2686 is rotatable by the actuator 2688. The support shaft 2686 is movable upward and downward. The arm 2682 is coupled to an upper end of the support shaft 2686. The arm 2682 extends from the support shaft 2686 at a right angle thereto. The nozzle 2690 is fixedly coupled to an end of the arm 2682. As the support shaft 2686 is rotated, the nozzle 2690 is able to swing together with the arm 2682. The nozzle 2690 may swing between the process position and the standby position. Selectively, the arm 2682 is movable forward and backward along the lengthwise direction thereof. When viewed from above, the path along which the nozzle 2690 is moved may be in agreement with the central axis of the substrate W in the process position.

Figure 3:
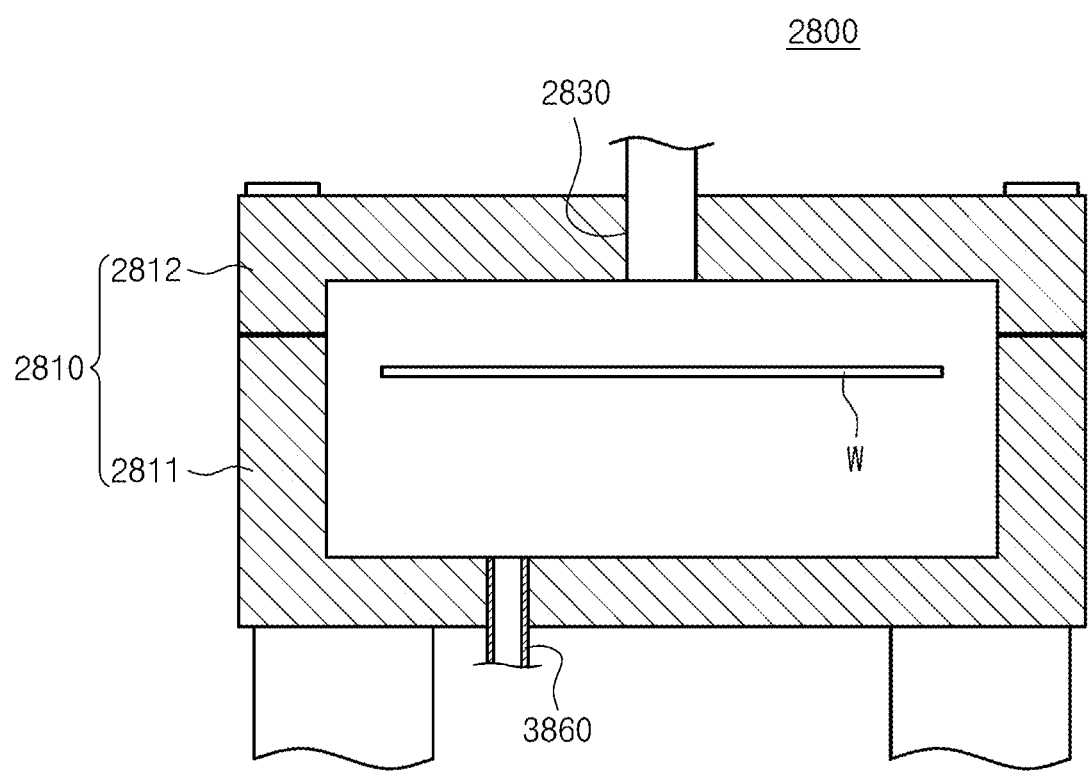
FIG. 3 is a view illustrating a substrate treating apparatus provided in a supercritical chamber of FIG. 1.

FIG. 3 is a view illustrating a substrate treating apparatus provided in the supercritical chamber of FIG. 1. Referring to FIG. 3, the supercritical chamber 280 may supply a supercritical fluid to a substrate W. The supercritical fluid may be carbon dioxide in a supercritical state. The substrate treating apparatus 2800 provided in the supercritical chamber 280 includes a housing 2810, a fluid supply unit 2830, and an exhaust unit 2860. The substrate W is supported by a support means (not illustrated) in a treatment space of the housing 2810.

The housing 2810 provides a space in which a supercritical process is performed. The housing 2810 includes a lower body 2811 and an upper body 2812 that are combined with each other to form the treatment space inside. The upper body 2812 is fixed in position, and the lower body 2811 is moved upward or downward. When the substrate W is loaded into or unloaded from the housing 2810, the lower body 2811 and the upper body 2812 are spaced apart from each other, and when a process is performed on the substrate W, the lower body 2811 and the upper body 2812 are brought into close contact with each other.

The fluid supply unit 2830 supplies the supercritical fluid into the housing 2810. The supercritical fluid may be carbon dioxide in a supercritical state. The exhaust unit 2860 releases the supercritical fluid from the housing 2810. The exhaust unit 2860 is provided at the lower body 2811.

Figure 4:
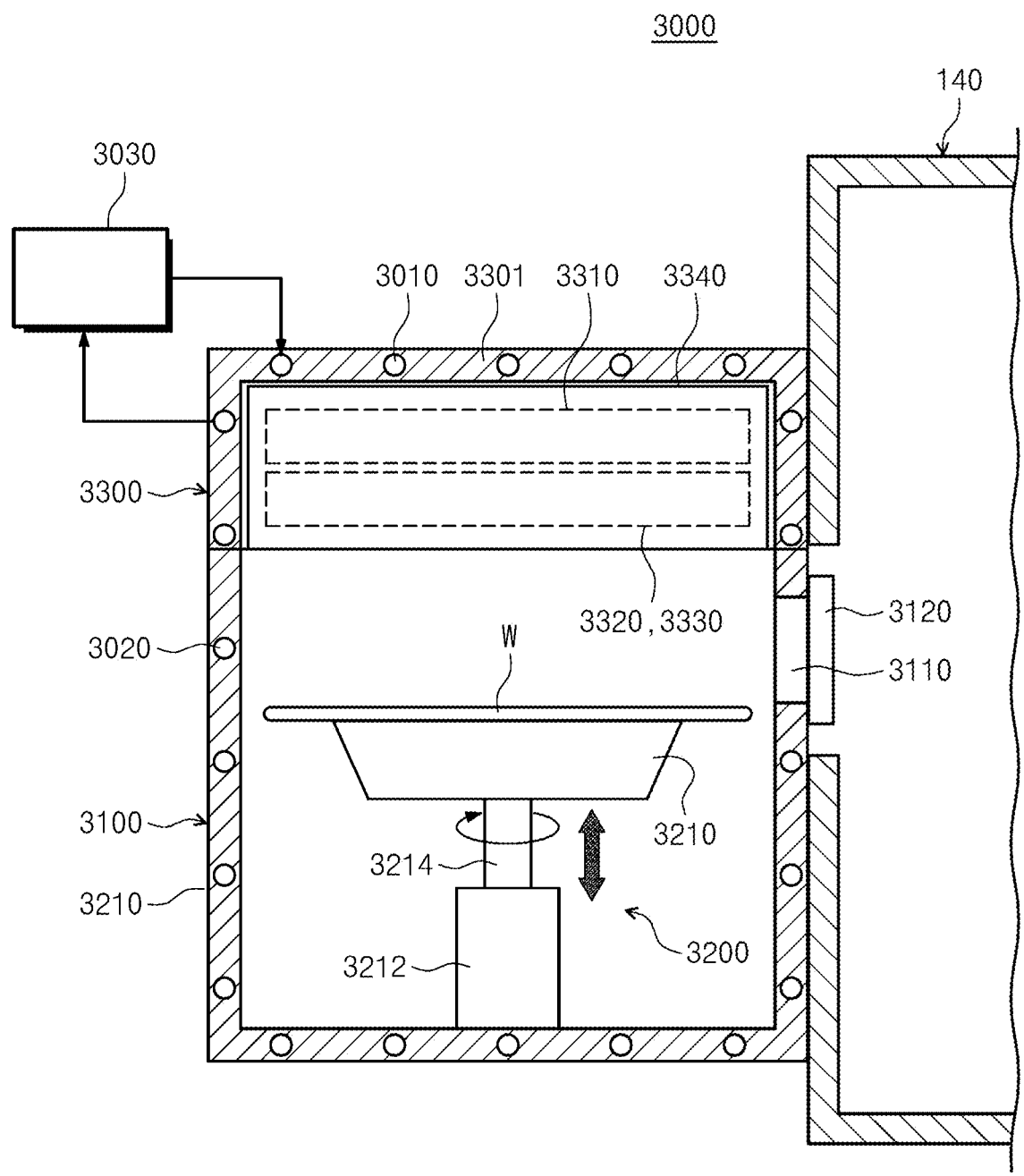
FIG. 4 is a sectional view illustrating a light treatment chamber according to an embodiment of the inventive concept.
Figure 5:
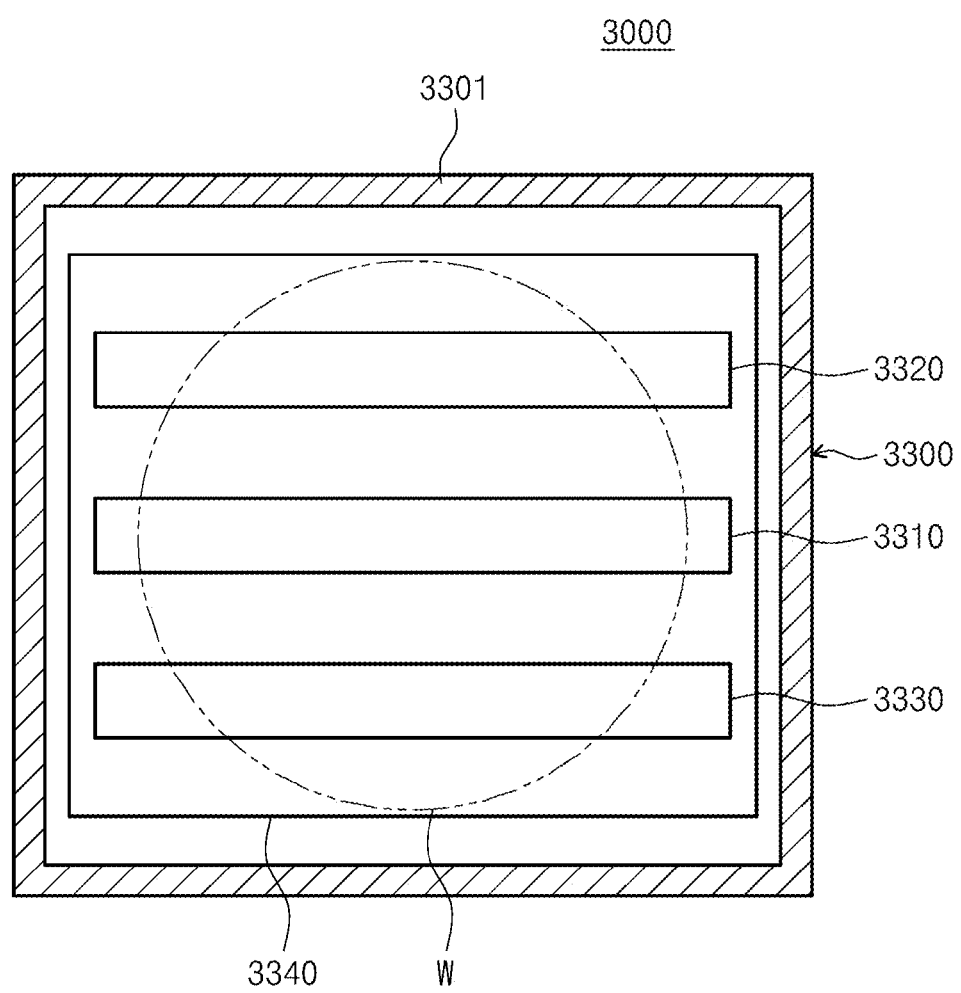
FIG. 5 is a plan view illustrating an irradiation unit of FIG. 4.
Figure 6:
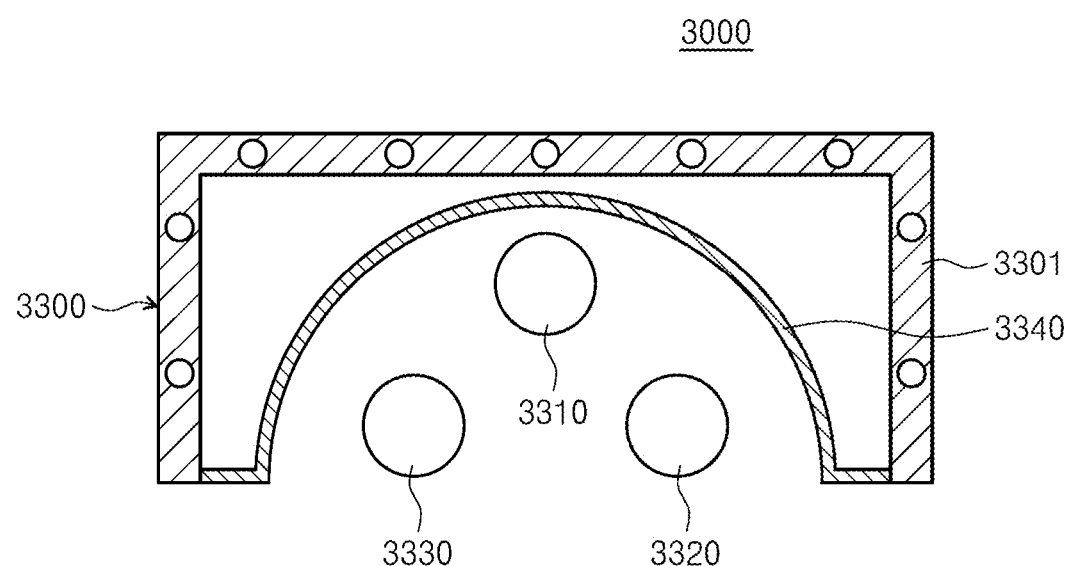
FIG. 6 is a sectional view of the irradiation unit of FIG. 4.

FIG. 4 is a sectional view illustrating a light treatment chamber according to an embodiment of the inventive concept. FIG. 5 is a plan view illustrating an irradiation unit of FIG. 4. FIG. 6 is a sectional view of the irradiation unit of FIG. 4.

Referring to FIGS. 4 to 6, a substrate treating apparatus 3000 is provided in the light treatment chamber 300. The light treatment chamber 300 may irradiate light to a substrate W treated in the liquid treatment chamber 260. Furthermore, the light treatment chamber 300 may irradiate light to a substrate W treated in the supercritical chamber 260. For example, the light treatment chamber 300 may irradiate light to a substrate W subjected to a drying process in the supercritical chamber 260. The light treatment chamber 300 may remove organic matter remaining on a substrate W by irradiating light to the substrate W.

The substrate treating apparatus 3000 provided in the light treatment chamber 300 may include a chamber 3100, a support unit 3200, and the irradiation unit 3300.

The chamber 3100 may have an interior space. The chamber 3100 may have a rectangular parallelepiped shape. The chamber 3100 may have a rectangular parallelepiped shape that is open at the top. The chamber 3100 may have an opening 3110 formed in a sidewall thereof, and the opening 3110 may be connected with the index chamber 140 and may be used as a passage through which the substrate W is loaded into or unloaded from the chamber 3100. The opening 3110 may be opened or closed by a door 3120.

The support unit 3200 may support the substrate W in the interior space of the chamber 3100. The support unit 3200 may be provided in the interior space of the chamber 3100. The support unit 3200 may include a support plate 3210, a lifting actuator 3212, and a rotary actuator 3214.

The support plate 3210 may support the substrate W. The support plate 3210 may have a plate shape. The support plate 3210 may have a seating surface on which the substrate W is supported. When viewed from the side, the support plate 3210 may have a shape that is wide at the top and narrow at the bottom. The support plate 3210 may have a gradually increasing area toward the top thereof. The support plate 3210 may clamp the substrate W by vacuum pressure. Alternatively, the support plate 3210 may clamp the substrate W by a mechanical clamping method. In another case, the substrate W may be placed on the seating surface of the support plate 3210 without a separate clamping device.

The lifting actuator 3212 may raise or lower the support plate 3210. The lifting actuator 3212 may adjust the distance between the substrate W and the irradiation unit 3300 by raising or lowering the support plate 3210. For example, when the irradiation unit 3300 irradiates light, the lifting actuator 3212 may decrease the distance between the substrate W and the irradiation unit 3300 by raising the support plate 3210. In contrast, in a case where the irradiation unit 3300 does not irradiate light, the lifting actuator 3212 may increase the distance between the substrate W and the irradiation unit 3300 by lowering the support plate 3210. Furthermore, the height of the support plate 3300 may be changed even while the irradiation unit 3300 irradiates light to the substrate W.

The rotary actuator 3214 may rotate the support plate 3210. The rotary actuator 3214 may be provided at the bottom of the support plate 3210. The rotary actuator 3214 may be coupled with a lower surface of the support plate 3210. The rotary actuator 3214 may rotate the support plate 3210 when the irradiation unit 3300 irradiates light. Accordingly, light may be uniformly irradiated to the substrate W.

The irradiation unit 3300 may be disposed at the top of the chamber 3100. The irradiation unit 3300 may irradiate light to the substrate W supported on the support unit 3200. The irradiation unit 3300 may include a housing 3301, light sources 3310, 3320, and 3330, and a reflector 3340. The light sources 3310, 3320, and 3330 may include the first light source 3310, the second light source 3320, and the third light source 3330.

The housing 3301 may have an interior space. The housing 3301 may have a rectangular parallelepiped shape. The housing 3301 may have a rectangular parallelepiped shape that is open at the bottom. The housing 3301 may have a shape corresponding to the chamber 3100. The housing 3301 may be combined with the chamber 3100 to form an interior space. The housing 3301 may be provided at the top of the chamber 3100 and may be combined with the chamber 3100.

The first light source 3310, the second light source 3320, and the third light source 3330 may irradiate light. The first light source 3310, the second light source 3320, and the third light source 3330 may have a bar shape. When viewed from above, the first light source 3310, the second light source 3320, and the third light source 3330 may be alternately disposed such that adjacent light sources differ from one another. When viewed from above, the second light source 3320, the first light source 3310, and the third light source 3330 may be disposed in a serial order. Furthermore, the first light source 3310, the second light source 3320, and the third light source 3330 may be disposed at different heights. For example, the first light source 3310 may be disposed in a higher position than the second light source 3320. The first light source 3310 may be disposed in a higher position than the third light source 3330. The second light source 3320 and the third light source 3330 may be disposed at the same height.

The first light source 3310 may irradiate first light L1 to the substrate W. The second light source 3320 may irradiate second light L2 to the substrate W. The third light source 3330 may irradiate third light L3 to the substrate W. The first light source 3310 may be one of a flash lamp that irradiates a flash, an infrared lamp that irradiates infrared light, and an ultraviolet lamp that irradiates ultraviolet light. The second light source 3320 may be one of a flash lamp that irradiates a flash, an infrared lamp that irradiates infrared light, and an ultraviolet lamp that irradiates ultraviolet light. The third light source 3330 may be one of a flash lamp that irradiates a flash, an infrared lamp that irradiates infrared light, and an ultraviolet lamp that irradiates ultraviolet light.

Hereinafter, it will be exemplified that the first light source 3310 is a flash lamp, the second light source 3320 is an ultraviolet lamp, and the third light source 3330 is an infrared lamp. Without being limited thereto, however, the types of the first light source 3310, the second light source 3320, and the third light source 3330 may be diversely changed.

Furthermore, in the drawings, the irradiation unit 3300 is illustrated as including the first light source 3310, the second light source 3320, and the third light source 3330. However, the inventive concept is not limited thereto. For example, only a selected one of the light sources 3310, 3320, and 3330 may be used. For example, the first light source 3310 may be provided alone in the irradiation unit 3300. Alternatively, the second light source 3320 may be provided alone in the irradiation unit 3300. In another case, the third light source 3330 may be provided alone in the irradiation unit 3300. In another case, the first light source 3310 and the second light source 3320 may be provided in the irradiation unit 3300. In another case, the first light source 3310 and the third light source 3330 may be provided in the irradiation unit 3300. In another case, the second light source 3320 and the third light source 3330 may be provided in the irradiation unit 3300.

Hereinafter, light irradiated by the first light source 3310 is defined as the first light L1, light irradiated by the second light source 3320 is defined as the second light L2, and light irradiated by the third light source 3330 is defined as the third light L3.

The first light L1 and the second light L2 may have different wavelength ranges. The first light L1 and the third light L3 may have different wavelength ranges. The second light L2 and the third light L3 may have different wavelength ranges.

For example, the first light L1 may have a wavelength range of 300 nm to 1000 nm. In a case where the first light source 3310 is implemented with a flash lamp, the energy of a flash irradiated by the first light source 3310 may be alternately changed every predetermined interval. Radiant heat of the first light L1 irradiated by the first light source 3310 may be transferred to organic matter P adhering to the substrate W.

The second light L2 may have a wavelength range of 400 nm or more. In a case where the second light source 3320 is implemented with an ultraviolet lamp, the second light L2 may have a wavelength of 254 nm or 185 nm. In a case where the second light L2 has a wavelength of 254 nm, the second light L2 may decompose ozone ($O_3$). Accordingly, the second light L2 may generate reactive oxygen species. In a case where the second light L2 has a wavelength of 185 nm, the second light L2 may decompose oxygen ($O_2$). Accordingly, the second light L2 may generate reactive oxygen species. Alternatively, the second light source 3320 may simultaneously irradiate the second light L2 having a wavelength of 254 nm and the second light L2 having a wavelength of 185 nm. In this case, the second light source 3320 may generate reactive oxygen species from ozone ($O_3$) and oxygen ($O_2$), thereby improving efficiency in treating the substrate W.

The third light L3 may have a wavelength range of 800 nm or more. In a case where the third light source 3330 is implemented with an infrared lamp, the third light L3 may transfer heat to the organic matter P adhering to the substrate W. Accordingly, the organic matter P may be carbonized.

The reflector 3340 may reflect light irradiated by the irradiation unit 3300 toward the surface of the substrate W supported on the support unit 3200. For example, the reflector 3340 may reflect light irradiated by the first light source 3310, the second light source 3320, and the third light source 3330 toward the surface of the substrate W. The reflector 3340 may be formed of a material capable of reflecting light. The reflector 3340 may be provided to surround the first light source 3310, the second light source 3320, and the third light source 3330. For example, the reflector 3340 may have a shape that surrounds an area over the first light source 3310, the second light source 3320, and the third light source 3330. Furthermore, when viewed from the side, the reflector 3340 may have a round shape. For example, the reflector 3340 may have a cylindrical shape that is open at one side.

When the first light source 3310, the second light source 3320, and the third light source 3330 irradiate light, the temperatures of the respective light sources 3310, 3320, and 3330 rise. Therefore, the substrate treating apparatus 3000 provided in the light treatment chamber 300 may have a cooling means. For example, the cooling means may include a first cooling line 3010 installed in the housing 3301, a second cooling line 3020 installed in the chamber 3100, and a refrigerant supply source 3030 that supplies a refrigerant into the first cooling line 3010. The refrigerant may be a cooling fluid. The cooling fluid may be cooling water. Alternatively, the refrigerant may be a cooling gas. The cooling fluid supplied through the refrigerant supply source 3030 circulates through the first cooling line 3010 and the second cooling line 3020. The first cooling line 3010 and the second cooling line 3020 may be connected with each other.

A controller (not illustrated) may control the substrate treating apparatus 10. The controller may control the substrate treating apparatus 10 to perform a substrate treating method that will be described below. For example, the controller may control the liquid treatment chamber 260, the transfer unit, and the light treatment chamber 300 such that the substrate W is treated in the liquid treatment chamber 260 and then transferred to the light treatment chamber 300. Furthermore, the controller may control the supercritical chamber 280, the transfer unit, and the light treatment chamber 300 such that the substrate W is treated in the supercritical chamber 280 and then transferred to the light treatment chamber 300.

Hereinafter, a substrate treating method according to an embodiment of the inventive concept will be described. The substrate treating method according to the embodiment of the inventive concept may include a liquid treatment step, a supercritical treatment step, and a light treatment step.

The liquid treatment step may be a step of treating the substrate W by dispensing a treatment liquid such as an organic solvent onto the substrate W. The liquid treatment step may be performed in the liquid treatment chamber 260. The supercritical treatment step may be a step of treating the substrate W by supplying a supercritical fluid to the substrate W. The supercritical treatment step may be performed in the supercritical chamber 280. The light treatment step may be a step of removing organic matter remaining on the substrate W by irradiating light to the substrate W. The light treatment step may be performed in the light treatment chamber 300. The light treatment step may be performed after the supercritical treatment step. The light treatment step may be performed after the liquid treatment step. For example, the liquid treatment step, the supercritical treatment step, and the light treatment step may be sequentially performed.

Figure 7:
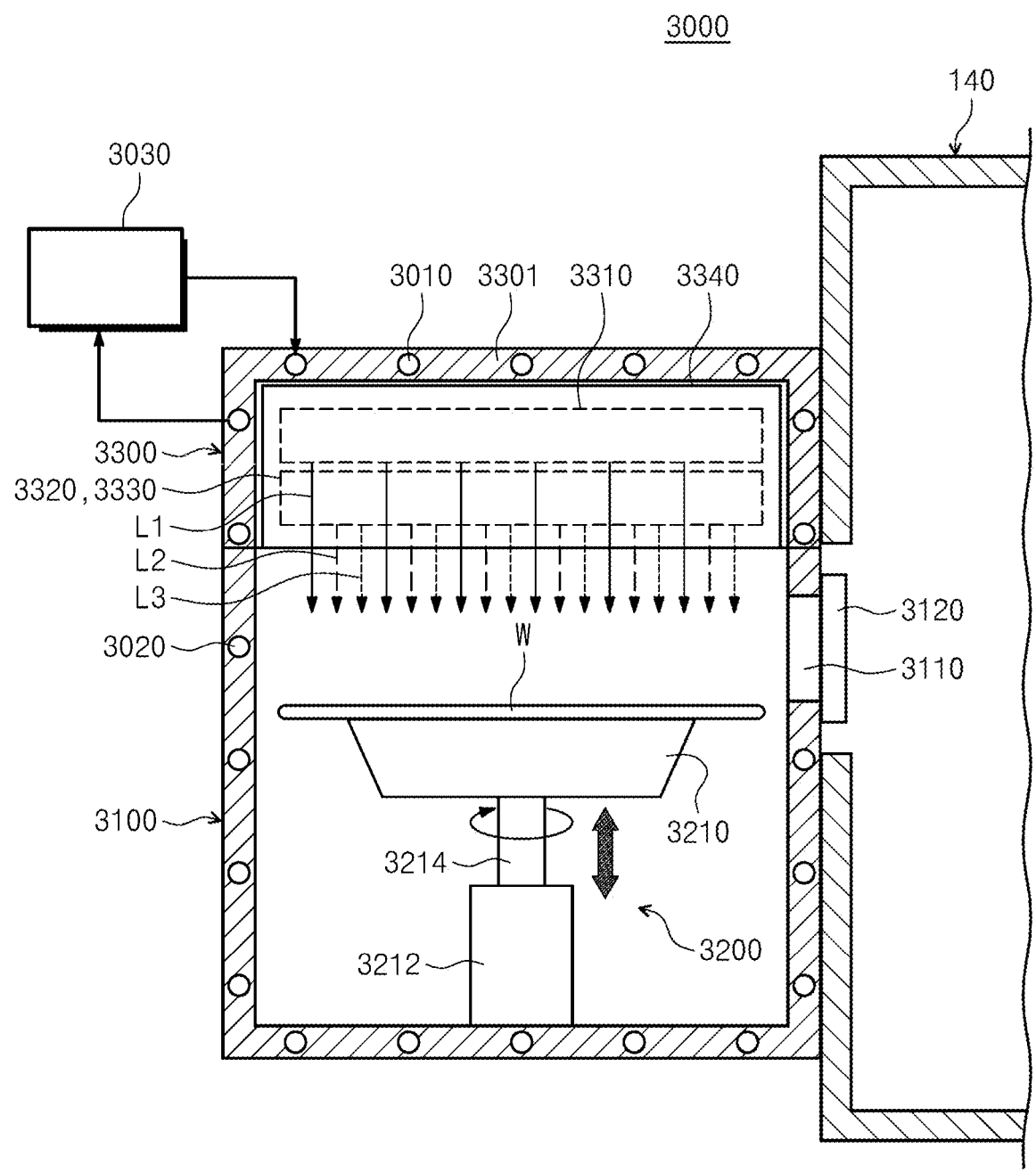
FIG. 7 is a view illustrating a state in which light is irradiated to a substrate in the light treatment chamber of FIG. 4.

Hereinafter, one example of the light treatment step will be described in detail. FIG. 7 is a view illustrating a state in which light is irradiated to a substrate in the light treatment chamber of FIG. 4. Referring to FIG. 7, the irradiation unit 3300 may irradiate light to the substrate W supported on the support unit 3200. The irradiation unit 3300 may irradiate the first light L1, the second light L2, and the third light L3 to the substrate W supported on the support unit 3200. The first light L1 and the second light L2 may be simultaneously or sequentially irradiated. The first light L1 and the third light L3 may be simultaneously or sequentially irradiated. The second light L2 and the third light L3 may be simultaneously or sequentially irradiated. The first light L1, the second light L2, and the third light L3 may be simultaneously or sequentially irradiated. While the light is irradiated to the substrate W, the substrate W may be rotated. Alternatively, while the light is irradiated to the substrate W, the light sources irradiating the light may rotate. In addition, while the light is irradiated to the substrate W, the distance between the substrate W and the irradiation unit 3300 may be adjusted.

Figure 8:
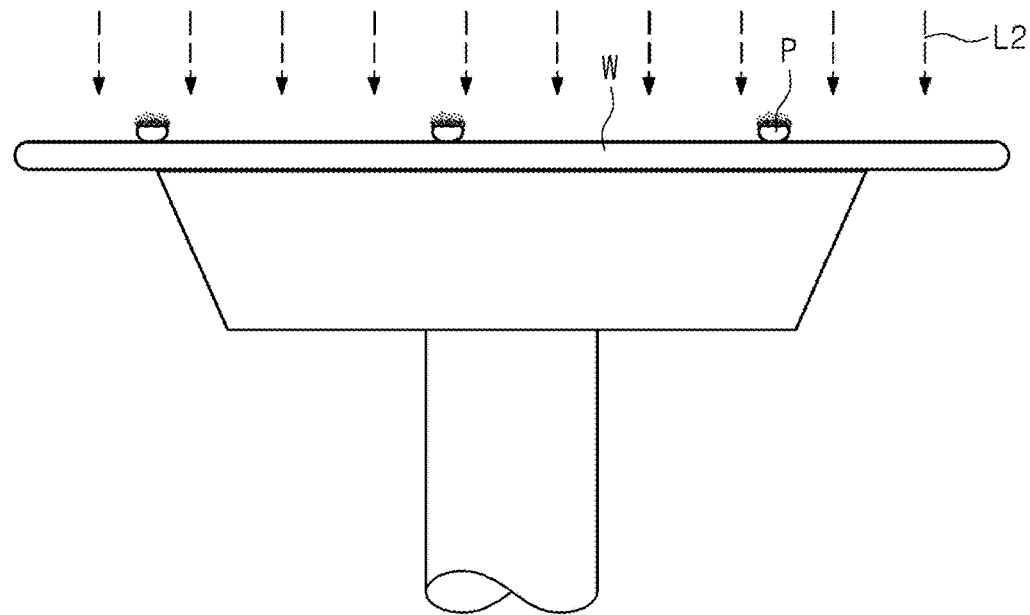
FIG. 8 is a view illustrating a state in which a second light source of FIG. 4 irradiates second light to treat a substrate.
Figure 9:
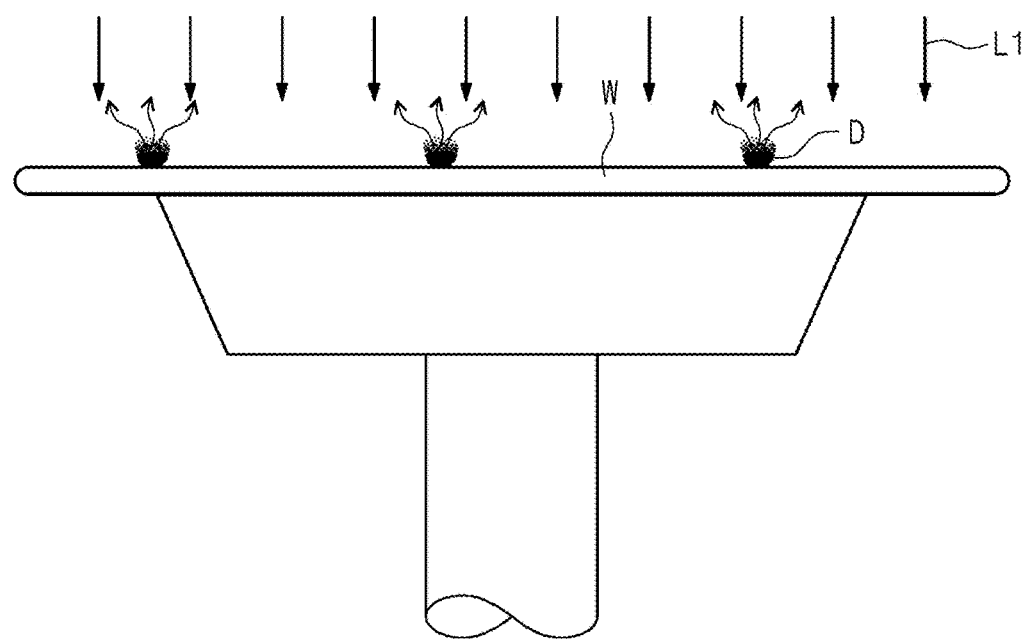
FIG. 9 is a view illustrating a state in which a first light source of FIG. 4 irradiates first light to treat the substrate.

FIG. 8 is a view illustrating a state in which the second light source of FIG. 4 irradiates the second light to treat a substrate, and FIG. 9 is a view illustrating a state in which the first light source of FIG. 4 irradiates the first light to treat the substrate.

Referring to FIG. 8, the second light L2 may be irradiated to the substrate W. The second light L2 may be ultraviolet light. The second light L2 may have a wavelength of 400 nm or less. The second light L2 may have a wavelength of 254 nm or 185 nm. The second light L2 may generate an active material. The second light L2 may generate reactive oxygen species from oxygen or ozone. The reactive oxygen species generated by the second light L2 may react with the organic matter P adhering to the substrate W. The organic matter P reacting with the reactive oxygen species may be decomposed. Furthermore, the organic matter P reacting with the reactive oxygen species may be oxidized. Accordingly, the particle size of the organic matter P may be decreased.

Referring to FIG. 9, the first light L1 may be irradiated to the substrate W after the second light L2 is irradiated to the substrate W. The first light L1 may be a flash. The first light L1 may have a wavelength range of 300 nm to 1000 nm. The flash irradiated by the first light source 3310 may generate radiant heat. The radiant heat generated by the first light L1 may remove the organic matter P adhering to the substrate W. For example, the radiant heat may sublimate the organic matter P.

Although it has been exemplified that the first light L1 is irradiated after the second light L2 is irradiated, the inventive concept is not limited thereto. For example, the first light L1 and the second light L2 may be simultaneously irradiated to the substrate W.

Figure 10:
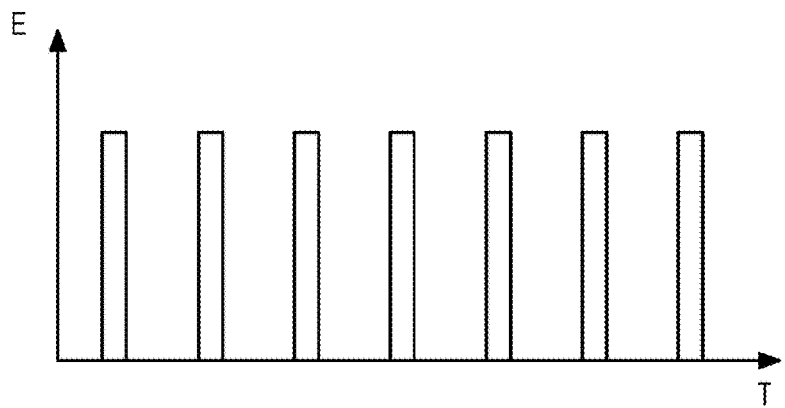
FIG. 10 is a view illustrating a change in energy transferred to a substrate by the first light over time.
Figure 11:
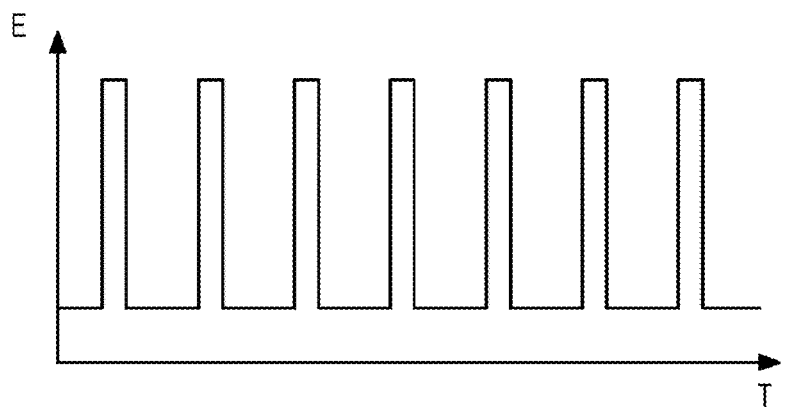
FIG. 11 is a view illustrating a change in energy transferred to a substrate by the first light and the third light of FIG. 4 over time.

FIG. 10 is a view illustrating a change in energy transferred to a substrate by the first light over time, and FIG. 11 is a view illustrating a change in energy transferred to a substrate by the first light and the third light of FIG. 4 over time.

Referring to FIGS. 10 and 11, the first light L1 irradiated by the first light source 3310 may be a flash. The energy of the flash irradiated by the first light source 3310 may be alternately changed every preset interval. Accordingly, higher energy may be transferred to the substrate W even though the first light source 3310 irradiates light with the same output. When the first light source 3310 alone irradiates the first light L1, the organic matter P may not be appropriately removed in a time range in which the energy of the first light L1 is low. Therefore, according to an embodiment of the inventive concept, the first light L1 and the third light L3 may be simultaneously irradiated to the substrate W. Thus, energy transferred to the substrate W in the time range in which the energy of the first light L1 is low may be increased. That is, the temperature of the substrate W may be raised and maintained by irradiating the third light L3. Furthermore, the organic matter P adhering to the substrate W may be effectively removed through the first light L1.

In addition, when the first light L1, the second light L2, and the third light L3 described above are irradiated to the substrate W, reactive oxygen species may be generated and may decrease the particle size of the organic matter P adhering to the substrate W, the temperature of the substrate W may be raised and maintained, and the organic matter P may be effectively removed by irradiating light having high energy at the same output to the substrate W.

Figure 12:
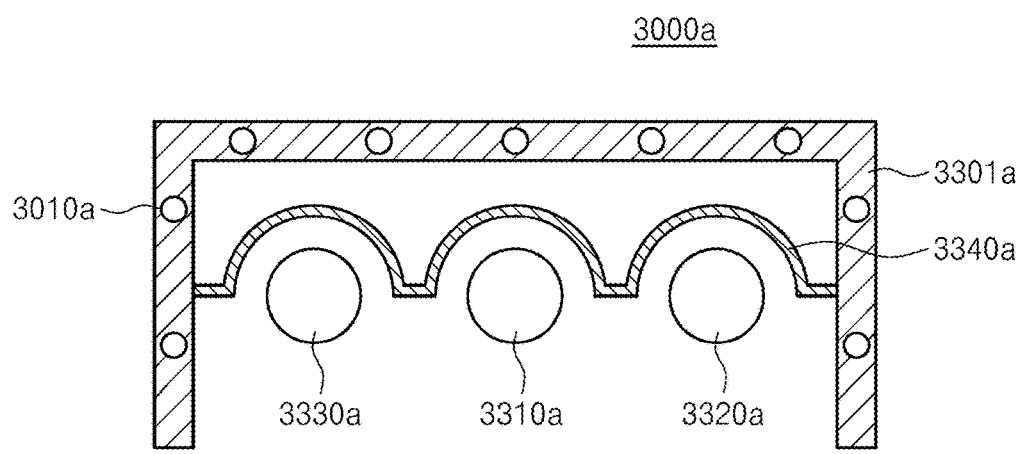
FIG. 12 is a view illustrating part of a light treatment chamber according to another embodiment of the inventive concept.

FIG. 12 is a view illustrating part of a light treatment chamber according to another embodiment of the inventive concept. Referring to FIG. 12, a substrate treating apparatus 3000a provided in the light treatment chamber may include a reflector 3340a. The reflector 3340a may be provided to surround a first light source 3310a, a second light source 3320a, and a third light source 3330a. In this embodiment, three reflectors may be installed as the three light sources are installed. A housing 3301a, a first cooling line 3010a, the first light source 3310a, the second light source 3320a, and the third light source 3330a are the same as, or similar to, those described above. Therefore, detailed descriptions thereabout will be omitted.

Figure 13:
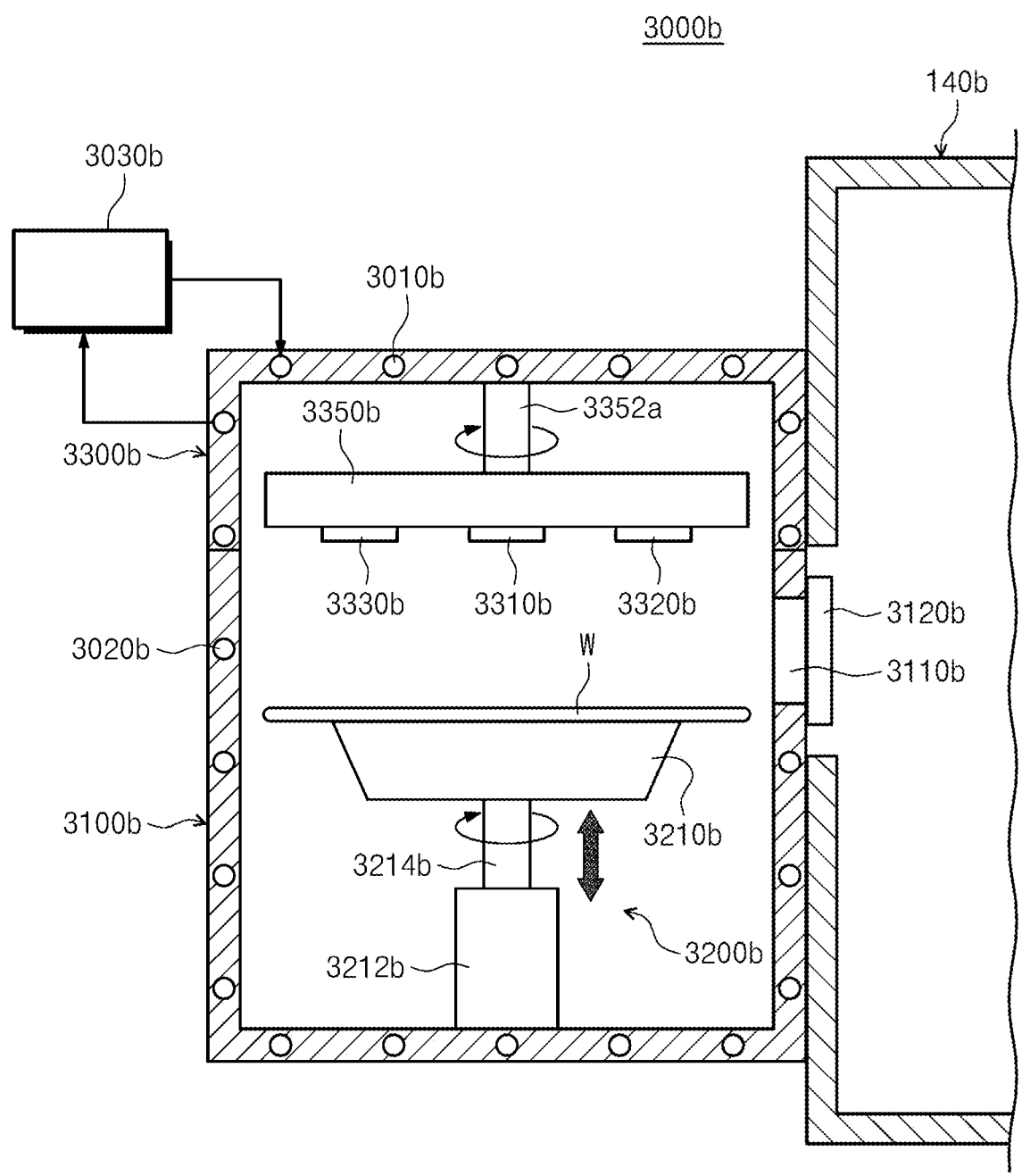
FIG. 13 is a sectional view illustrating a light treatment chamber according to another embodiment of the inventive concept.
Figure 14:
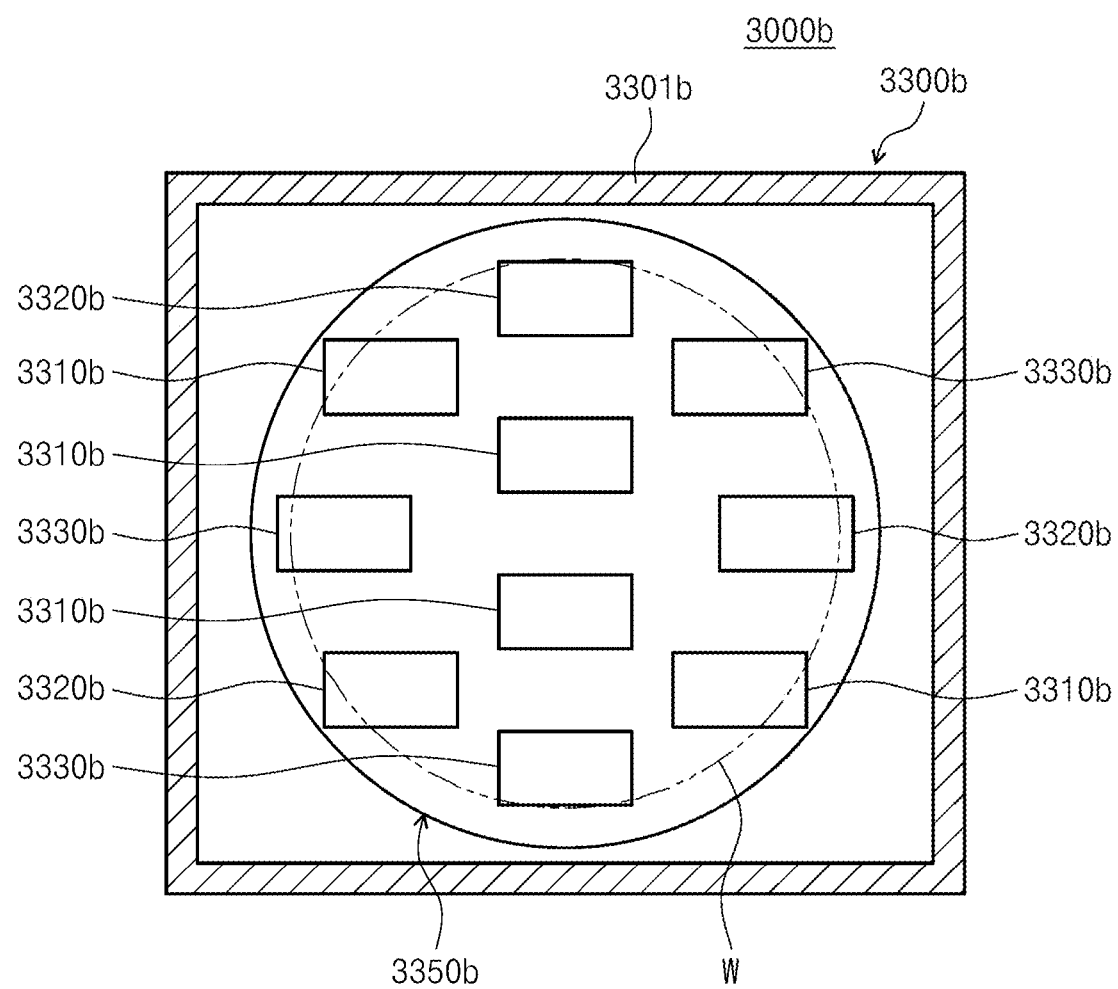
FIG. 14 is a plan view illustrating an irradiation unit of FIG. 13.

FIG. 13 is a sectional view illustrating a light treatment chamber according to another embodiment of the inventive concept, and FIG. 14 is a plan view illustrating an irradiation unit of FIG. 13. With the exception of the irradiation unit 3300b, a substrate treating apparatus 3000b provided in the light treatment chamber according to the other embodiment of the inventive concept is the same as, or similar to, the substrate treating apparatuses described above. Therefore, the following description will be focused on a difference therebetween.

The irradiation unit 3300b may include a plate 3350b. The plate 3350b may be disposed over a support unit 3210b. The plate 3350b may be coupled with a drive member 3352a. The drive member 3352a may rotate the plate 3350b.

Light sources 3310b, 3320b, and 3330b irradiating light may have a block shape. The light sources 3310b, 3320b, and 3330b having the block shape may be provided on the plate 3350b so as to be detachable. The light sources 3310b, 3320b, and 3330b may have pins, and the plate 3350b may have holes into which the pins are inserted. Furthermore, a plurality of light sources 3310b, a plurality of light sources 3320b, and a plurality of light sources 3330b may be arranged in a lateral direction and/or a longitudinal direction. Here, the lateral direction and/or the longitudinal direction does not mean only a straight direction. Furthermore, when viewed from above, the light sources 3310b, 3320b, and 3330b may be alternately mounted on the plate 3350b such that adjacent light sources differ from one another. In this case, light may be more uniformly irradiated to a substrate W than in a case where light sources are provided in a bar shape.

Figure 15:
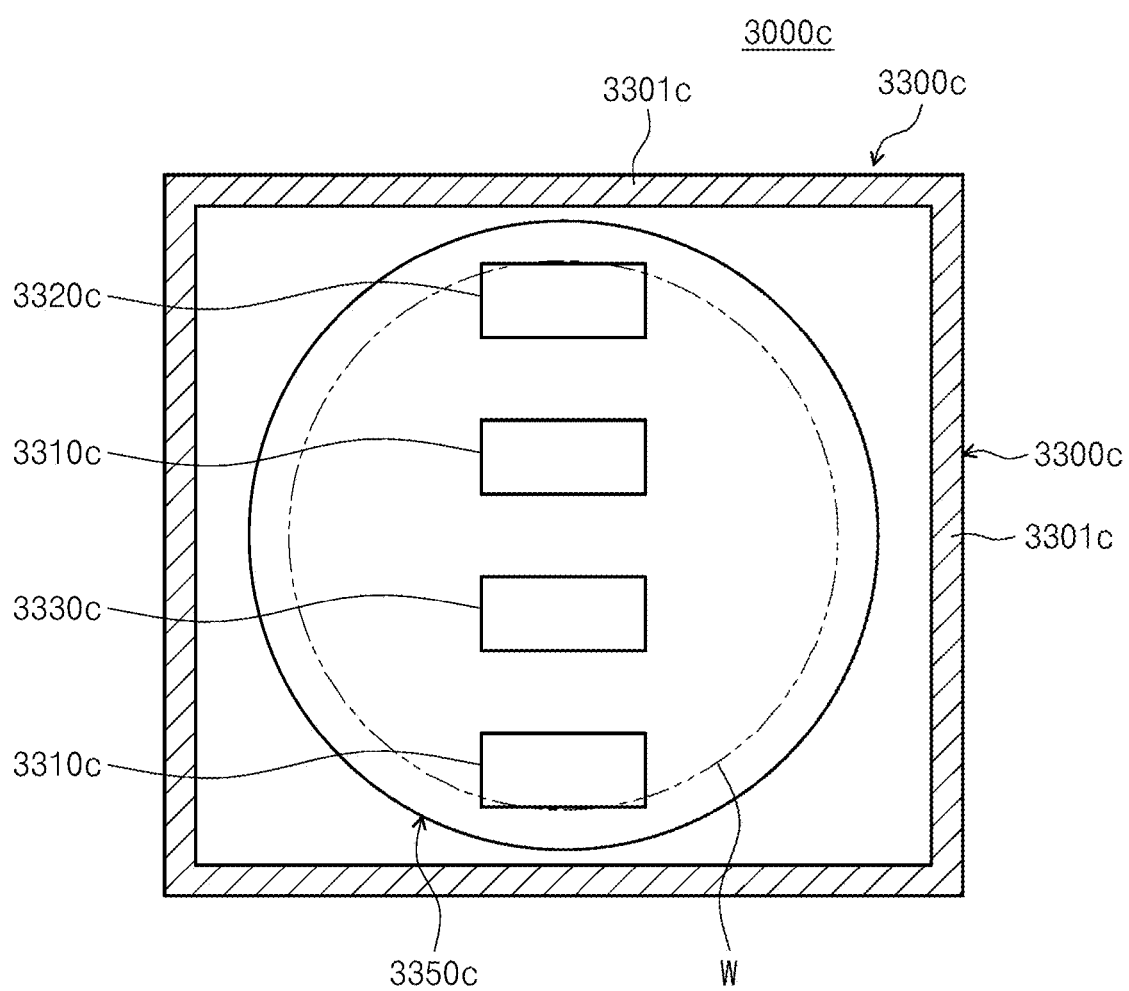
FIG. 15 is a view illustrating part of a light treatment chamber according to another embodiment of the inventive concept.

FIG. 14 illustrates one example that the light sources 3310b, 3320b, and 3330b are disposed in a circular shape as a whole. However, as illustrated in FIG. 15, the light sources 3310b, 3320b, and 3330b may be disposed on a straight line when viewed from above.

Figure 16:
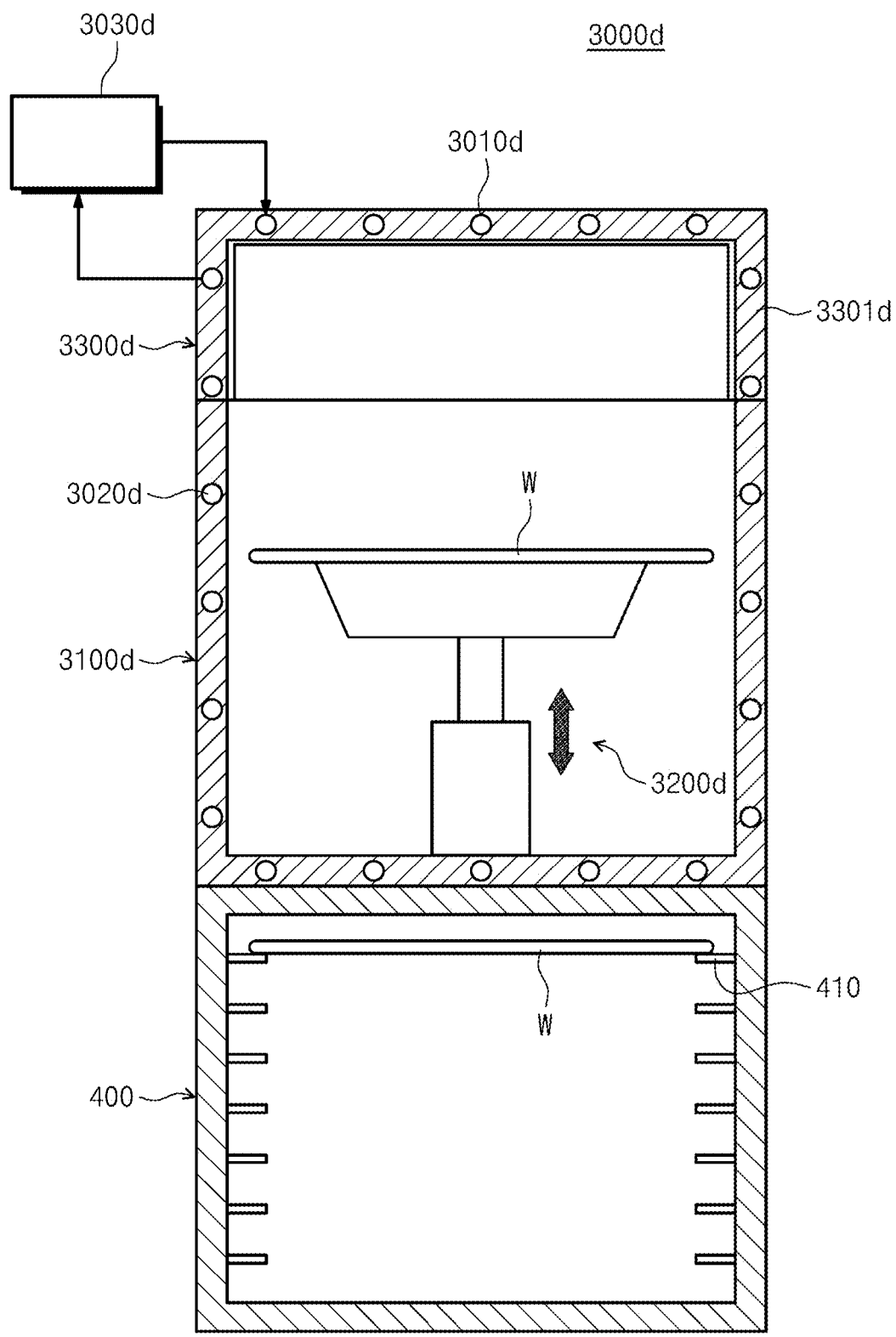
FIG. 16 is a view illustrating a light treatment chamber according to another embodiment of the inventive concept.

FIG. 16 is a view illustrating a light treatment chamber according to another embodiment of the inventive concept. A buffer chamber 400 may be provided under a chamber 3100d that the light treatment chamber 3000d has.

The buffer chamber 400 may include a plurality of slots 410 for temporarily storing substrates W. The substrates W may be transferred into the buffer chamber 400 after removal of organic matter P in the chamber 3100d. The substrates W in the buffer chamber 400 may be transferred into a carrier by the index robot 144 after the substrates W are cooled to a temperature at which the substrates W are able to be transferred. Although not illustrated, a means for lowering the temperatures of the substrates W may be added to the buffer chamber 400.

Figure 17:
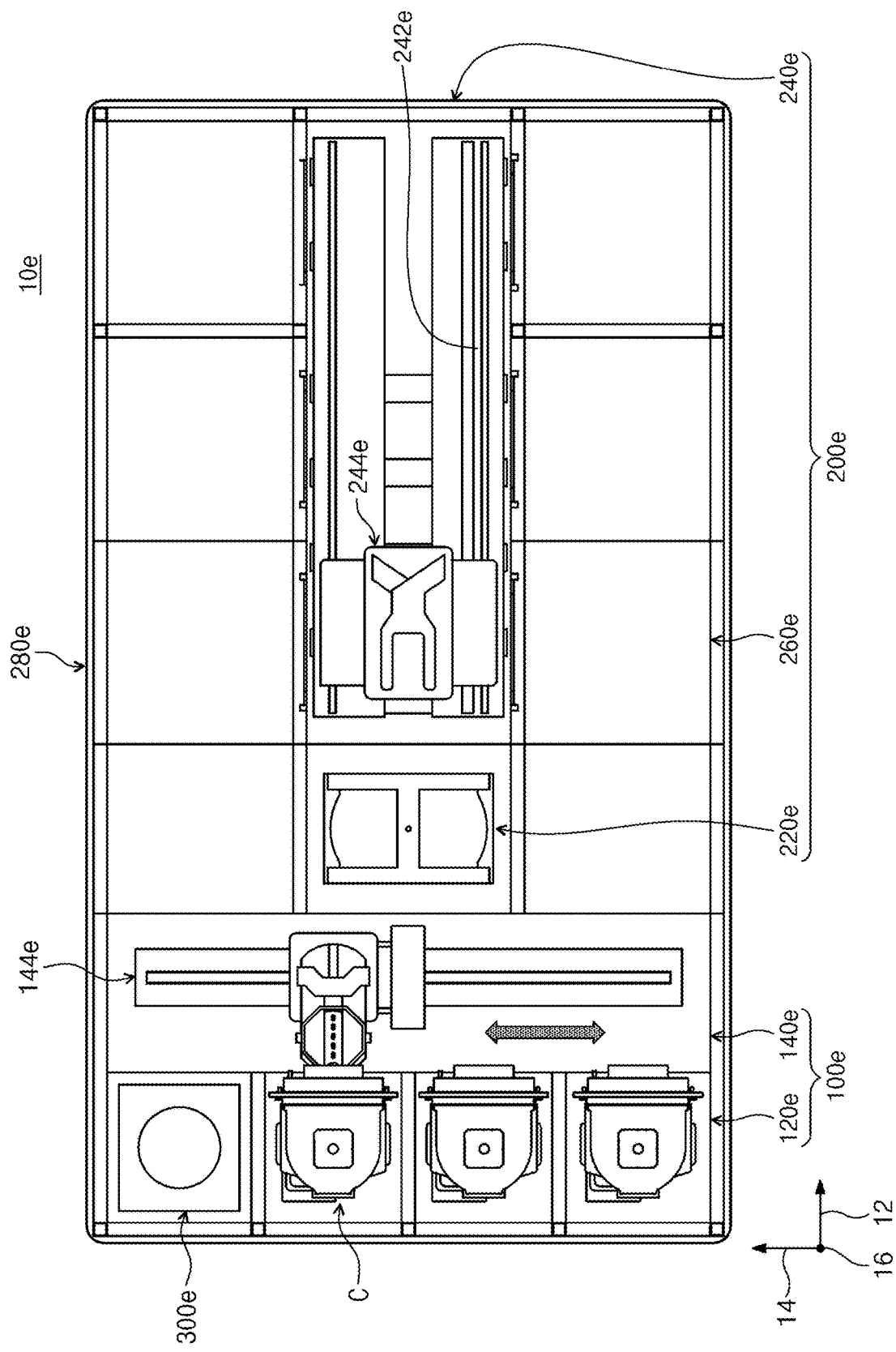
FIG. 17 is a schematic plan view illustrating a substrate treating apparatus according to another embodiment.
Figure 18:
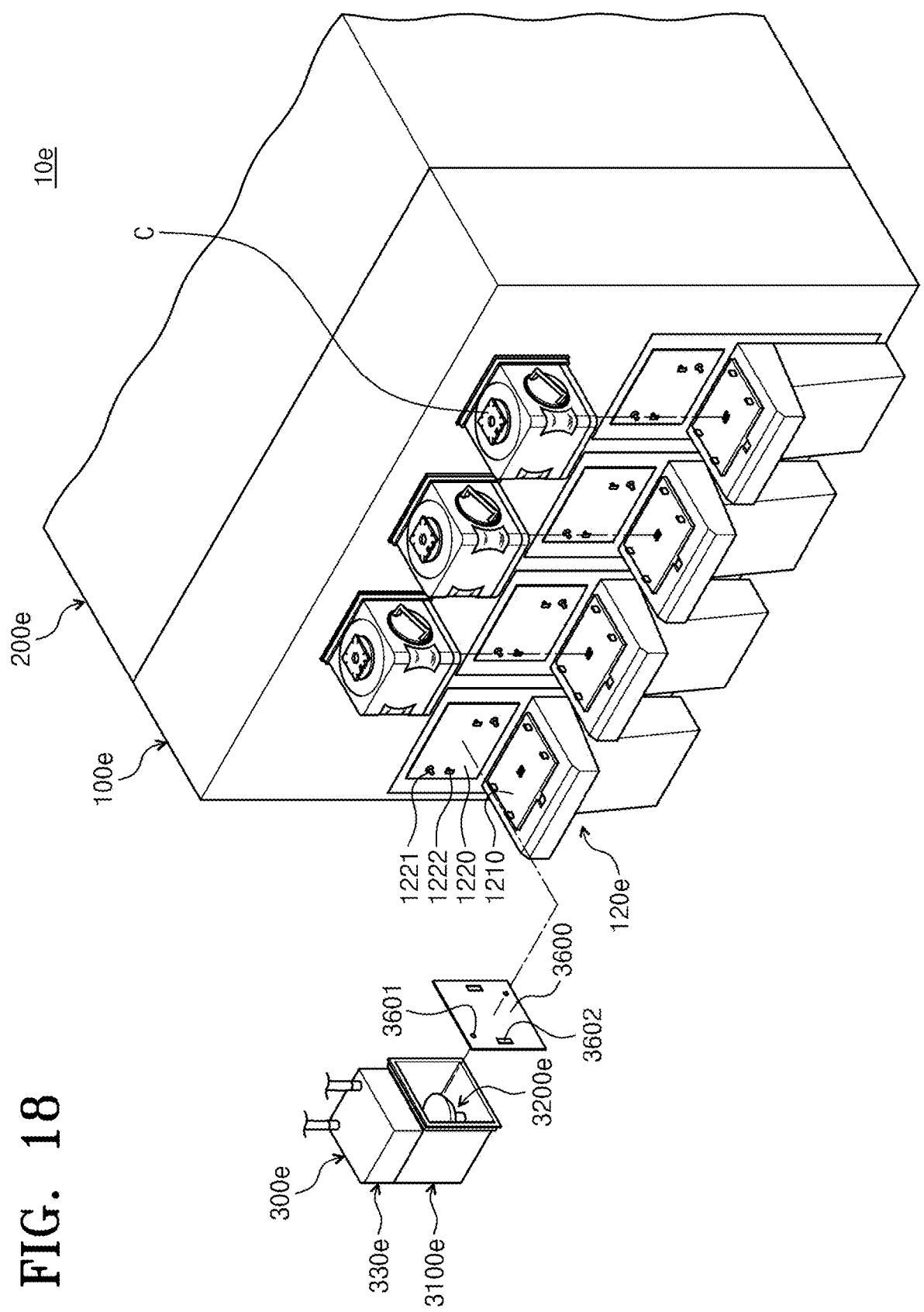
FIG. 18 is a perspective view illustrating major parts of an index module illustrated in FIG. 17.
Figure 19:
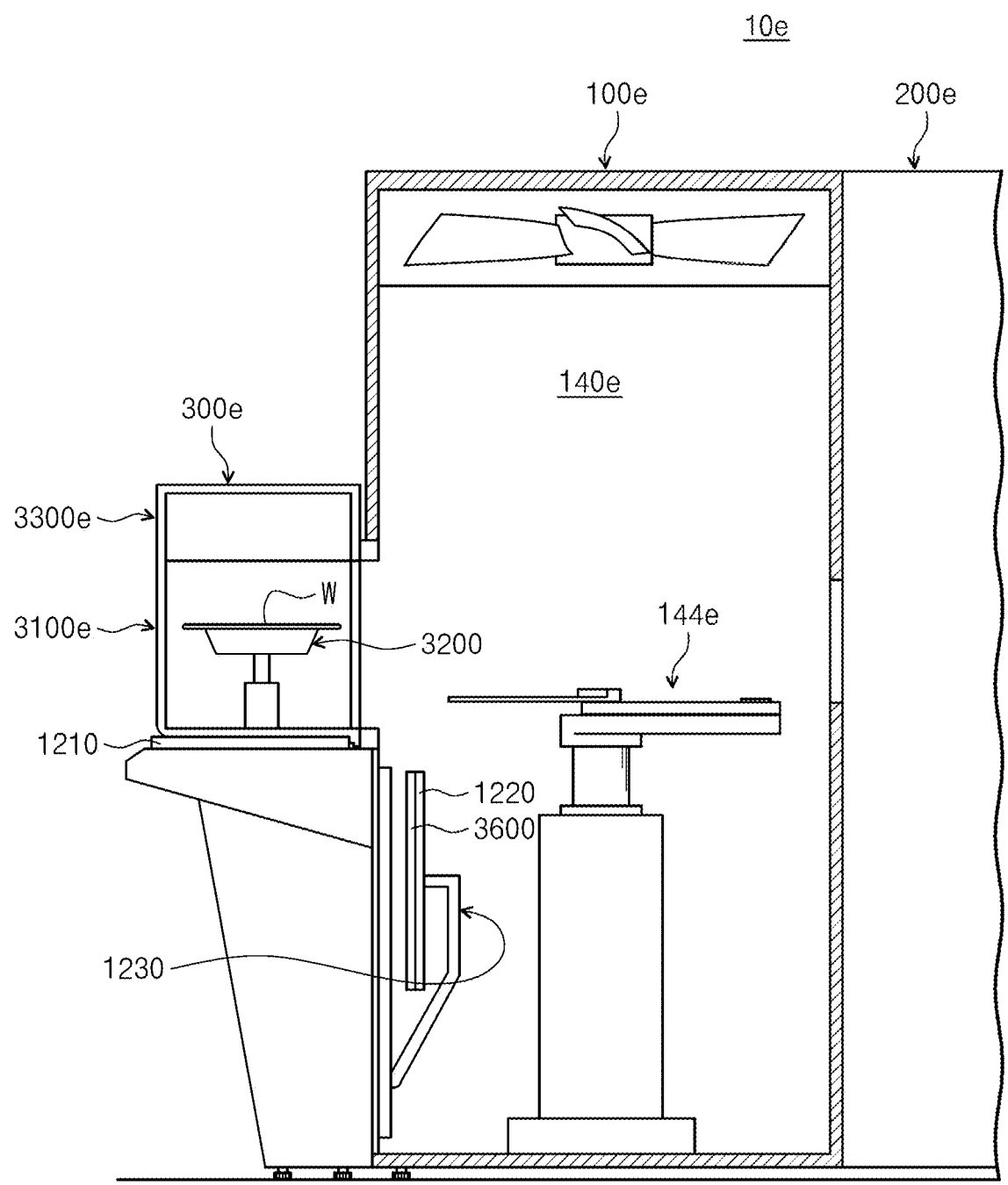
FIG. 19 is a side sectional view illustrating a light treatment chamber installed on a load port.

FIG. 17 is a schematic plan view illustrating a substrate treating apparatus according to another embodiment. FIG. 18 is a perspective view illustrating major parts of an index module illustrated in FIG. 17. FIG. 19 is a side sectional view illustrating a light treatment chamber installed on a load port.

Referring to FIGS. 17 to 19, the substrate treating apparatus 10e according to the other embodiment includes the index module 100e, a process module 200e, and the light treatment chamber 300e. The index module 100e, the process module 200e, and the light treatment chamber 300e have configurations and functions substantially similar to the configurations and functions of the index module 100, the process module 200, and the light treatment chamber 300 illustrated in FIG. 1. Therefore, the following description will be focused on a difference therebetween.

The light treatment chamber 300e is characterized by being mounted on the load port 120e. Accordingly, without a considerable change in design, the light treatment chamber 300e may be additionally mounted on a substrate treating facility already installed in a semiconductor manufacturing line.

For example, the light treatment chamber 300e may be mounted on one load port among four load ports 120e disposed at the front of the index module 100e and may add a process of removing organic matter on the surface of a substrate before the substrate is transferred to a carrier C after a supercritical drying process.

To this end, the light treatment chamber 300e may include a carrier door 3600 that is opened or closed by a door opener 1230 in the state in which the light treatment chamber 300e is mounted on the load port 120e.

Likewise to a door of a general carrier (FOUP), the carrier door 3600 has a registration pin hole 3601 and a latch key hole 3602. The registration pin hole 3601 is used to determine a position, and the latch key hole 3602 is used to open or close the carrier door 3600.

Meanwhile, the load port 120e includes a drive table 1210 and a port door 1220, and the port door 1220 constitutes part of a front side of an index chamber 140e. Furthermore, in this embodiment, a wall of the index chamber 140e constitutes part of a FIMS face corresponding to a FOUP described in SEMI standards.

Reference numeral 1221 denotes a registration pin, and reference numeral 1222 denotes a latch key. Both the registration pin 1221 and the latch key 1222 are installed on the surface of the port door 1220. The registration pin 1221 serves to perform positioning in a state of being inserted into the registration pin hole 3601 formed in the carrier door 3600. Furthermore, the latch key 1222 is rotated after being inserted into the latch key hole 3602 formed in the carrier door 3600. Accordingly, a coupling member (not illustrated) of a clamping mechanism may be removed from a chamber 3100e, and thus the carrier door 3600 may be opened. This operation may be performed identically to an operation of opening or closing a FOUP door described in SEMI standards.

As described above, according to the embodiments of the inventive concept, the substrate treating apparatus and method may improve efficiency in treating a substrate.

Furthermore, according to the embodiments of the inventive concept, the substrate treating apparatus and method may efficiently remove organic matter remaining on a substrate.

In addition, according to the embodiments of the inventive concept, the light treatment chamber may be easily mounted on an existing substrate treating apparatus.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a light treatment chamber having an interior space;
   a support unit configured to support the substrate in the interior space; and
   an irradiation unit disposed above the support unit and configured to irradiate light downward to the substrate in the interior space to remove organic matter remaining on the substrate,
   wherein the irradiation unit includes:
   a first light source configured to irradiate first light to the substrate;
   a second light source configured to irradiate second light to the substrate, the second light having a different wavelength range from the first light,
   the first light is disposed at a different height from the second light source,
   the first light source having a wavelength of 300 nm to 1000 nm, and
   the second light source having a wavelength of at least one of 185 nm, 254 nm, and 400 nm or more.

2. The apparatus of claim 1, wherein
   the irradiation unit further includes a third light source configured to irradiate the substrate, the third light source having a different wavelength range of 800 nm or more.

3. The apparatus of claim 2, wherein the first light source is a flash lamp,
   wherein the second light source is one of an infrared lamp and an ultraviolet lamp, and
   wherein the third light source is the other of the infrared lamp and the ultraviolet lamp.

4. The apparatus of claim 1, wherein the support unit includes:
   a support plate configured to support the substrate; and
   a lifting actuator configured to raise or lower the support plate.

5. The apparatus of claim 1, wherein the support unit includes:
   a support plate configured to support the substrate; and
   a rotary actuator configured to rotate the support plate.

6. The apparatus of claim 1, wherein the irradiation unit further includes a reflector configured to reflect the light irradiated by the irradiation unit toward a surface of the substrate supported on the support unit.

7. The apparatus of claim 1, wherein the irradiation unit further includes a first cooling line through which a cooling fluid circulates to lower a temperature of a light source included in the irradiation unit.

8. The apparatus of claim 7, wherein the light treatment chamber includes a second cooling line connected with the first cooling line, wherein the cooling fluid circulates through the second cooling line.

9. The apparatus of claim 1, wherein the apparatus further comprises:
   a supercritical chamber configured to treat the substrate with a supercritical fluid applied to the substrate;
   a transfer unit configured to transfer the substrate between the supercritical chamber and the light treatment chamber; and
   a controller, and
   wherein the controller is configured to control the supercritical chamber, the transfer unit, and the light treatment chamber such that the substrate is treated in the supercritical chamber and the substrate treated in the supercritical chamber is transferred to the light treatment chamber.

10. The apparatus of claim 1, wherein the apparatus further comprises:
    a liquid treatment chamber configured to treat the substrate with an organic solvent applied onto the substrate;
    a transfer unit configured to transfer the substrate between the liquid treatment chamber and the light treatment chamber; and
    a controller, and
    wherein the controller is configured to control the liquid treatment chamber, the transfer unit, and the light treatment chamber such that the substrate is treated in the liquid treatment chamber and the substrate treated in the liquid treatment chamber is transferred to the light treatment chamber.

11. The apparatus of claim 1, wherein the apparatus further comprises:
    an index module having a load port configured to have a carrier having the substrate received therein be mounted; and
    a process module connected with the index module and configured to treat the substrate with an organic solvent, and
    wherein the light treatment chamber is provided at the index module.

12. The apparatus of claim 11, wherein the index module includes a front panel on which the load port is installed, a rear panel disposed to be opposite to the front panel, and side panels configured to connect the front panel and the rear panel when viewed from above, and
    wherein the light treatment chamber is installed on one of the side panels.

13. The apparatus of claim 1, wherein the first and second light sources configured to irradiate light have a bar shape, and
   wherein the first and second light sources are alternately disposed over the support unit.

14. The apparatus of claim 1, wherein the first and second light sources configured to irradiate light have a block shape, and
   wherein the first and second light sources are arranged in a lateral direction and/or a longitudinal direction.

15. The apparatus of claim 14, wherein the irradiation unit further includes a plate disposed over the support unit,
   wherein the light sources having the block shape are provided on the plate so as to be detachable, and
   wherein when viewed from above, the light sources are alternately mounted on the plate such that adjacent light sources differ from one another.

16. The apparatus of claim 15, wherein the apparatus further comprises:
   a buffer chamber configured to hold the substrate which is transferred into the buffer chamber after removal of organic matter in the light treatment chamber.

17. The apparatus of claim 16, wherein the buffer chamber is provided under the light treatment chamber, and
   the buffer chamber includes:
   a plurality of slots for temporarily storing the substrate; and
   a cooling line configured to lower a temperatures of the substrate.

18. An apparatus for treating a substrate, the apparatus comprising:
   a light treatment chamber having an interior space;
   a support unit configured to support the substrate in the interior space; and
   an irradiation unit disposed above the support unit and configured to irradiate light downward to the substrate in the interior space to remove organic matter remaining on the substrate,
   wherein the irradiation unit includes:
   a first light source configured to irradiate first light to the substrate;
   a second light source configured to irradiate second light to the substrate, the second light having a different wavelength range from the first light; and
   a reflector configured to reflect the light irradiated by the irradiation unit toward a surface of the substrate supported on the support unit, wherein
   the first light source is disposed at a different height from the second light source,
   the reflector has a cylindrical shape, and
   the reflector surrounds the first light source and the second light source.

19. The apparatus of claim 18, wherein the first light source is one of a flash lamp, an infrared lamp, and an ultraviolet lamp, and
   wherein the second light source is another one of the flash lamp, the infrared lamp, and the ultraviolet lamp.

20. The apparatus of claim 19, wherein the first light source is the flash lamp, and
   wherein the second light source is one of the infrared lamp and the ultraviolet lamp.

* * * * *